(12) United States Patent
Arai et al.

(10) Patent No.: US 6,184,693 B1
(45) Date of Patent: Feb. 6, 2001

(54) ELECTROMAGNETIC NOISE MEASUREMENT APPARATUS

(75) Inventors: Kenichi Arai; Masahiro Yamaguchi; Shin Yabukami; Atsushi Itagaki; Mitsuharu Watanabe, all of Sendai; Kiichi Itagaki; Noboru Saito, both of Miyagi-Ken; Koichi Fuda, Sendai; Hiroshi Takahashi, Miyagi-Ken; Takashi Tamogami, Miyagi-Ken; Yukio Sakurada, Miyagi-Ken, all of (JP)

(73) Assignee: Kyodo Kumiai Joint-Labo Sendai, Miyagi-ken (JP)

( * ) Notice: Under 35 U.S.C. 154(b), the term of this patent shall be extended for 0 days.

(21) Appl. No.: 09/112,365

(22) Filed: Jul. 9, 1998

(30) Foreign Application Priority Data

Dec. 4, 1997 (JP) .................................................. 9-334361

(51) Int. Cl.$^7$ ................................................... G01R 29/26
(52) U.S. Cl. ............................ 324/613; 324/144; 324/247
(58) Field of Search .................................... 324/613, 144, 324/524, 537, 750, 247

(56) References Cited

U.S. PATENT DOCUMENTS

| 4,829,238 | 5/1989 | Goulette et al. . |
| 5,006,788 | 4/1991 | Goulette et al. . |

FOREIGN PATENT DOCUMENTS

| 5-67184 | 9/1993 | (JP) . |
| 6-58969 | 3/1994 | (JP) . |
| 6-58970 | 3/1994 | (JP) . |
| 6-58971 | 3/1994 | (JP) . |
| 8-129058 | 5/1996 | (JP) . |
| 10-1155645 | 5/1998 | (JP) . |

OTHER PUBLICATIONS

Yoichi Yamato, Hideaki Sone, Hiroshi Echigo, and Tasuku Takagi, "An Automatic Measurement System for Pattern of Electromagnetic Field," Faculty of Engineering, Tohoku University, EMCJ84–13 (1984), pp. 25–27, No Month Available.

(List continued on next page.)

*Primary Examiner*—Safet Metjahic
*Assistant Examiner*—Vincent Q. Nguyen
(74) *Attorney, Agent, or Firm*—Paul A. Guss

(57) ABSTRACT

A first substrate having a first electromagnetic noise sensor on its surface perpendicularly intersects with a second substrate having a second electromagnetic noise sensor on its surface, making up an integral structure. A first induced voltage value output from the first electromagnetic sensor at a position thereof directly before driving by a driving means is recorded, and a second induced voltage value output from the second electromagnetic noise sensor at a position thereof at a time of movement of the integral structure for only a predetermined distance by a driving means is recorded. Further, the first and second electromagnetic noise sensors are parallel connected at the position of movement, and a third induced voltage value output from a parallel connected electromagnetic noise sensor is also recorded. Based on the recorded first and second voltage values, an electromagnetic noise level in a vicinity of the integral substrate is determined. The first and second induced voltage values are compared, and based on comparison of the first and second induced voltage values, and whether a larger voltage value from among the first and second voltage values is larger than the third voltage value, a direction of an electromagnetic noise generating source in the vicinity of the integral substrate is computationally determined. The determined electromagnetic noise level and direction of the electromagnetic noise generating source are displayed at a position on a display device corresponding with a position of the first electromagnetic noise sensor.

13 Claims, 16 Drawing Sheets

OTHER PUBLICATIONS

Hideto Endo, Koichi Shimizu, Goro Matsumoto, "Measurement of Electric Field Distribution around a Human Model by an Optical Technique," Research Institute of Applied Electricity, Hokkaido University, EMCJ83–67(1983), pp. 63–68, No Month Avaiable.

M. Yamaguchi, S. Yabukami, M. Watanabe, A. Itagaki, K.I. Arai, "Electromagnetic Noise Measurements Using Microstrip Coil Array," Research Inst. of Electrical Communications, Tohoku University and Ryowa Electronics Co., Ltd., May 13, 1996.

Shin Yabukami, Masahiro Yamaguchi, Ken Ichi Arai, "Permeance Measurement of Magnetic Thin Film Using Shielded Loop Coil," National Convention Record I.E.E. Japan, 1996, p. 2–263, No Month Available.

S. Yabukami, M. Watanabe, M. Yamaguchi, K.I. Arai, "Measuring Noise from a Personal Computer by Using a Microstrip Coil Array," Journal of the Magnetic Society of Japan, vol. 20, No. 2, 1996, pp. 529–532, No Month Available.

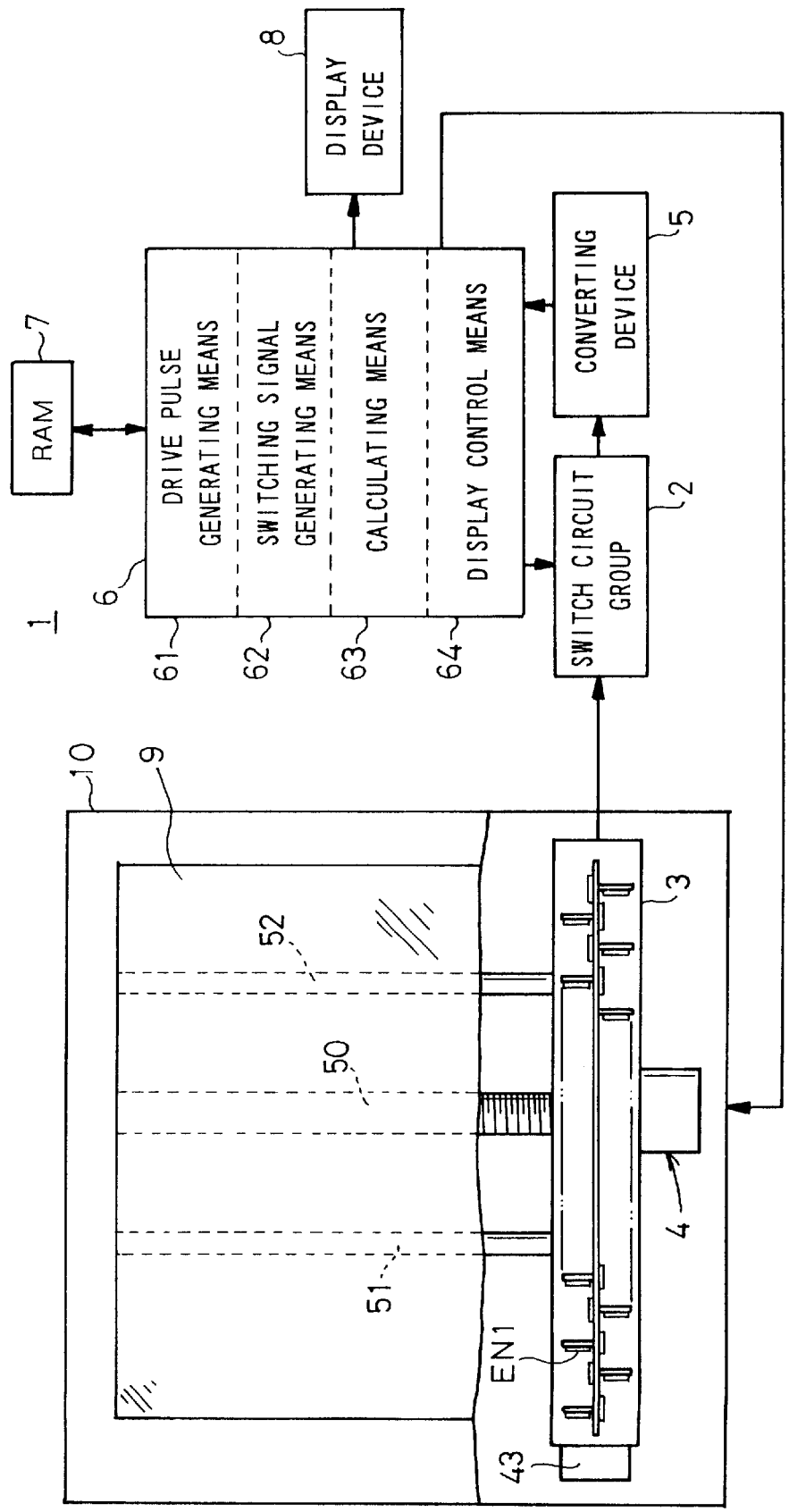

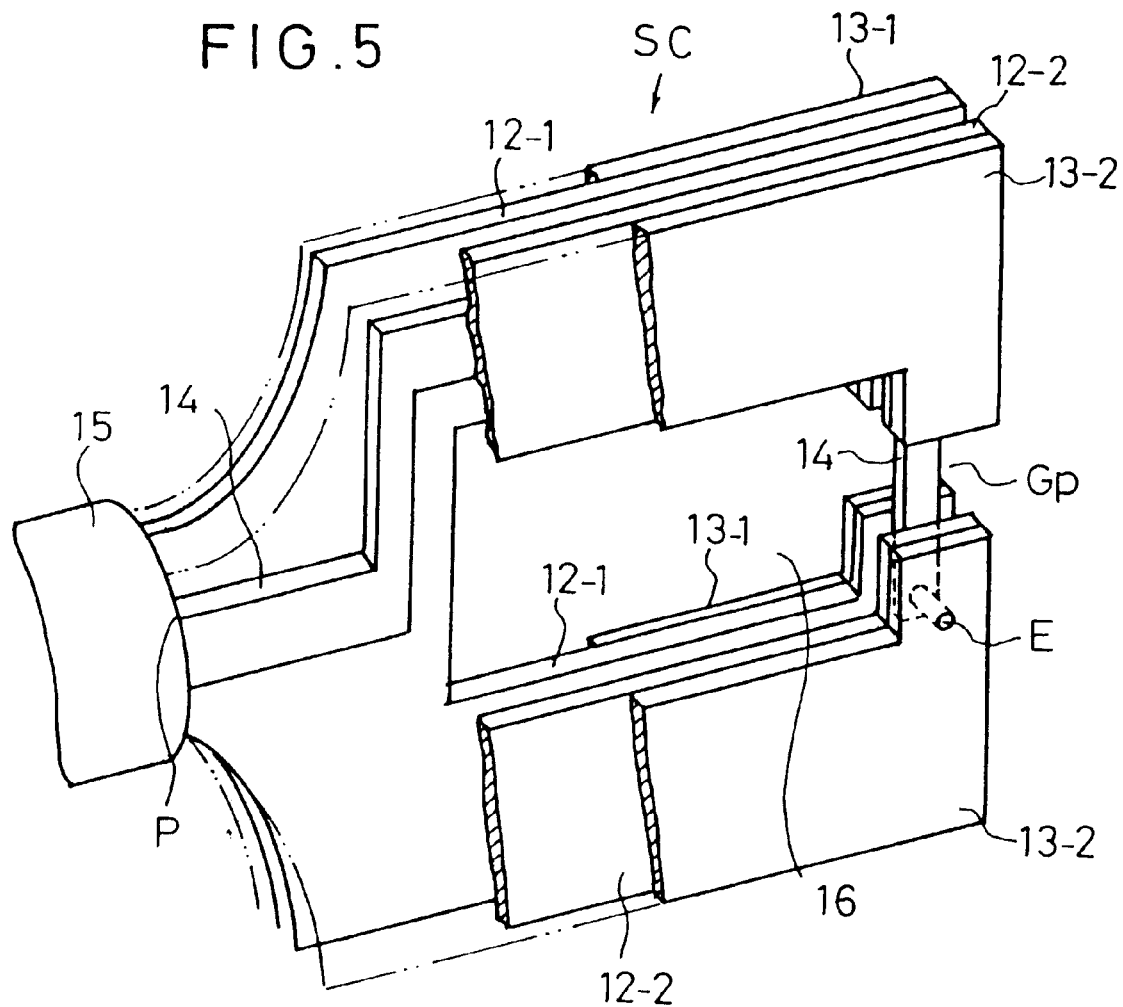

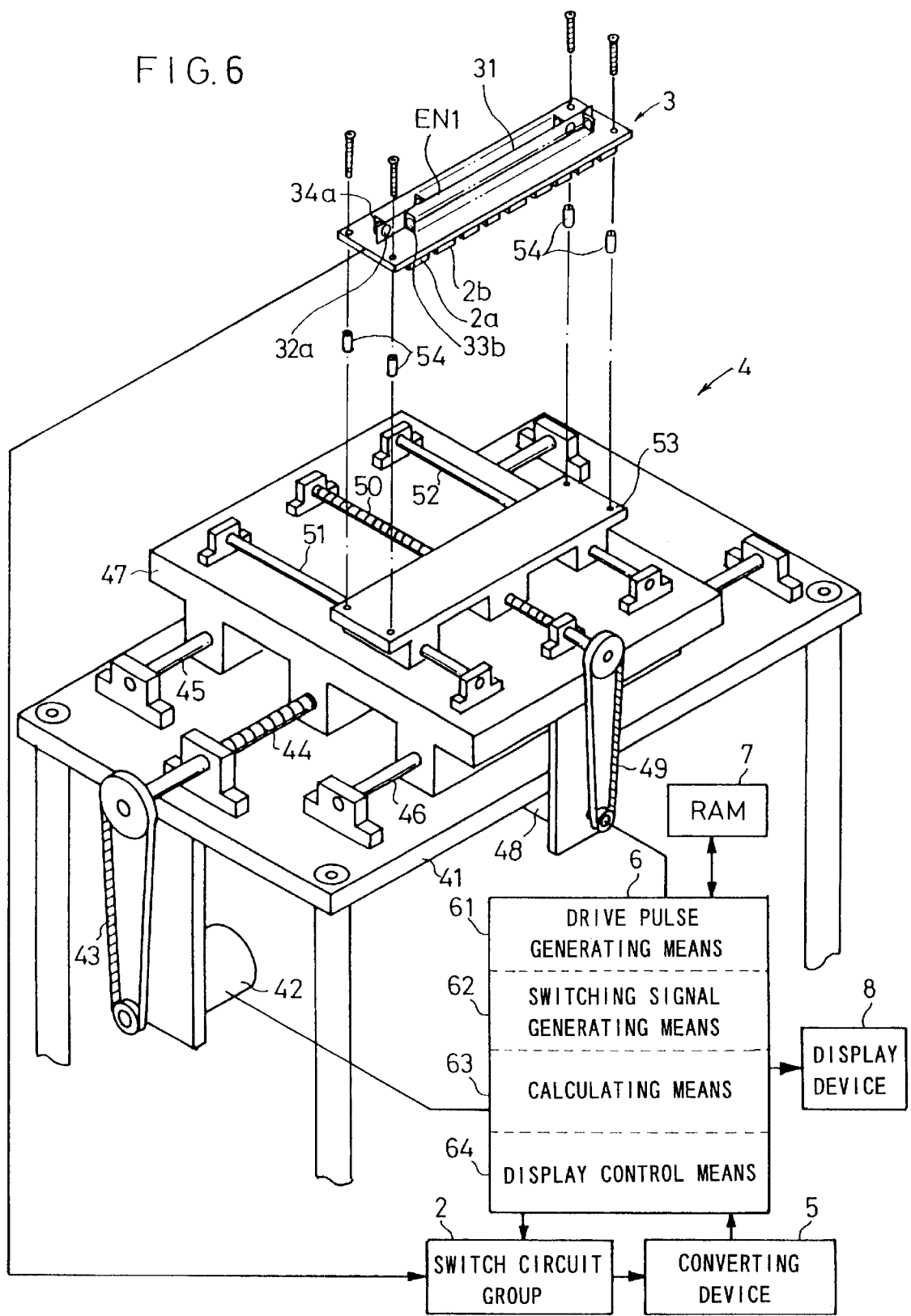

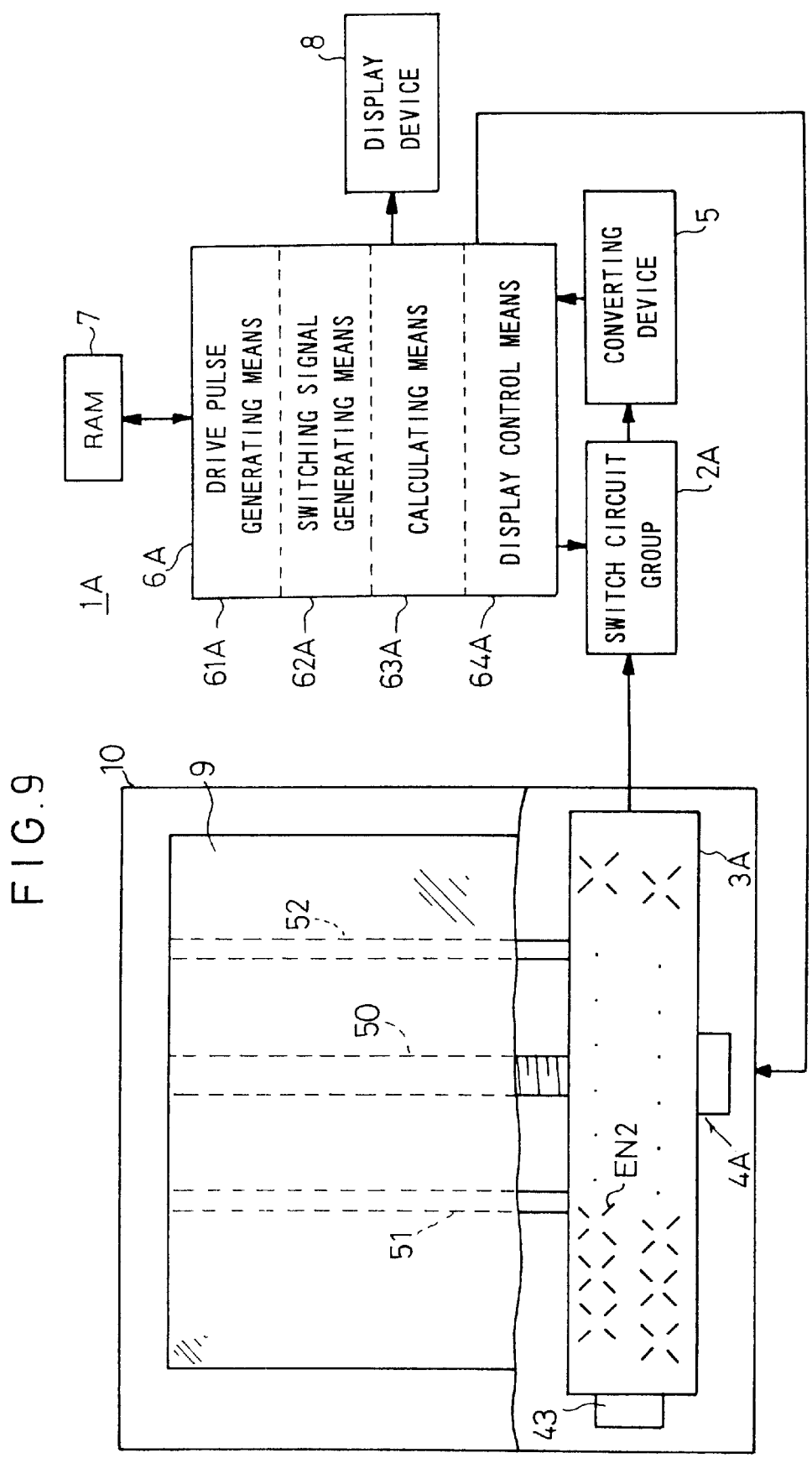

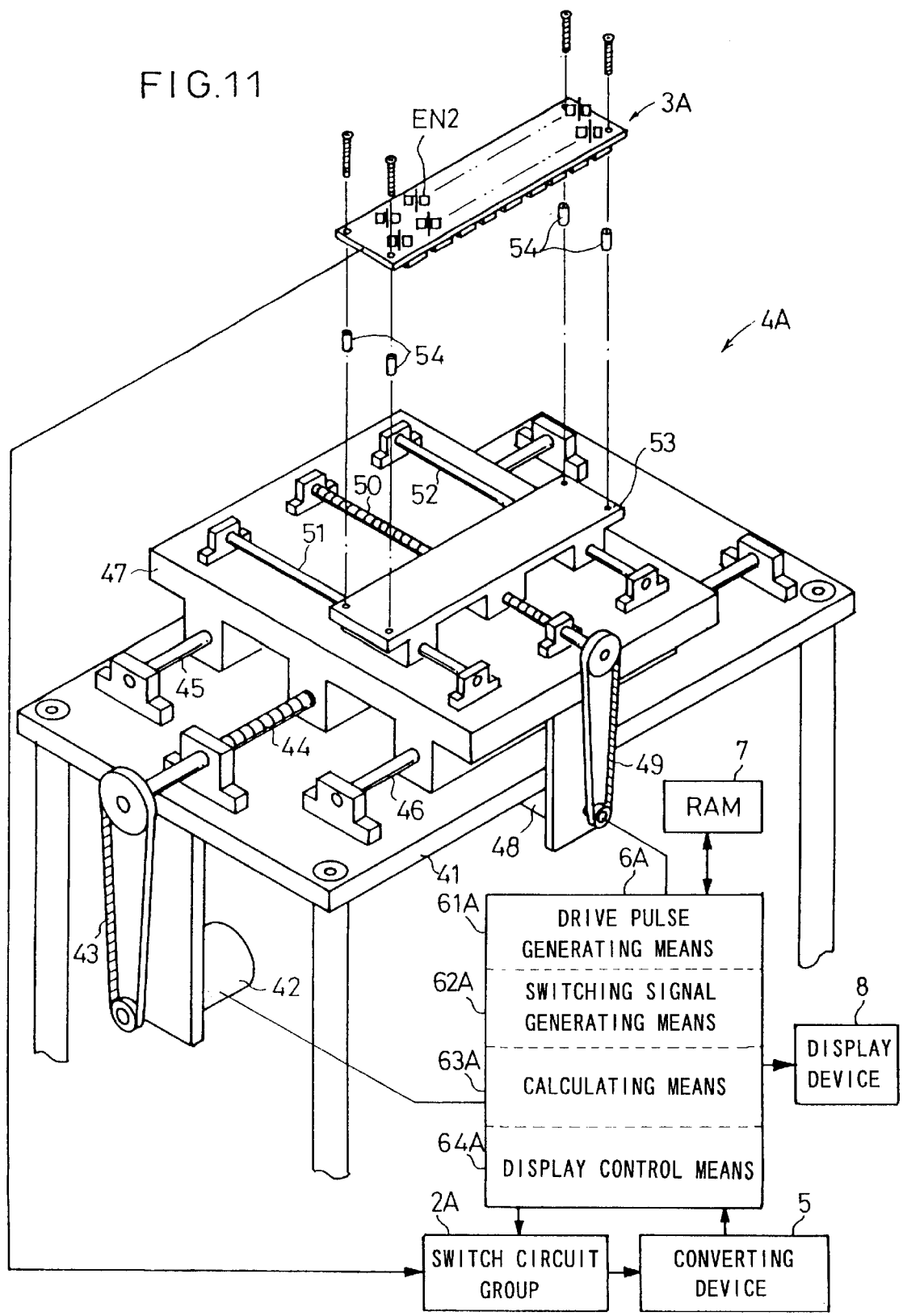

FIG.15

| θ | DISPLAY |
|---|---|
| $0° \leq \theta < 10°$ | — |
| $10° \leq \theta < 20°$ | ╱ |
| $20° \leq \theta < 30°$ | ╱ |
| $30° \leq \theta < 40°$ | ╱ |
| $40° \leq \theta < 50°$ | ╱ |
| $50° \leq \theta < 60°$ | ╱ |
| $60° \leq \theta < 70°$ | ╱ |
| $70° \leq \theta < 80°$ | ╱ |
| $80° \leq \theta < 90°$ | │ |
| $90° \leq \theta < 100°$ | │ |
| $100° \leq \theta < 110°$ | ╲ |
| $110° \leq \theta < 120°$ | ╲ |
| $120° \leq \theta < 130°$ | ╲ |
| $130° \leq \theta < 140°$ | ╲ |
| $140° \leq \theta < 150°$ | ╲ |
| $150° \leq \theta < 160°$ | ╲ |
| $160° \leq \theta < 170°$ | ╲ |
| $170° \leq \theta < 180°$ | — |

ELECTROMAGNETIC NOISE MEASUREMENT APPARATUS

BACKGROUND OF THE INVENTION
1. Field of the Invention

The present invention concerns an electromagnetic noise measurement apparatus for measuring electromagnetic noise generated from a concerned electromagnetic noise measurement body under operation, for example, a printed circuit board.

2. Description of the Related Art

In electrical devices, as represented by computers having a clock frequency exceeding 100 MHz, digitalization of such electrical devices and high speed operation thereof is progressing. Because high frequency noise is generated, including successive even and odd numbers from binary digital signals therefrom, an electromagnetic noise measurement apparatus covering the GHz band has been desired.

As types of electromagnetic noise measurement apparatuses for measuring electromagnetic noise, there are for example, the disclosures of Japanese Patent publication No. 5-67184, Japanese Laid-Open Patent publication No. 6-58969 and Japanese Laid-Open Patent publication No. 6-58970. In Japanese Patent publication No. 5-67184, an antenna made up of a wire which generates an electrical output corresponding to electromagnetic radiation from an electromagnetic radiating body is disposed in proximity to the electromagnetic radiating body, the output from the antenna is sequentially selected by a diode matrix and transmitted to a measurement receiving device, the electromagnetic radiation level is analyzed by the measurement signal receiving device, and a mapping showing electromagnetic radiation levels at positions confronting the antenna in the vicinity of the electromagnetic radiating body is generated from the analyzed measured electromagnetic radiation levels.

On the other hand, in the disclosures of Japanese Laid-Open Patent publication Nos. 6-58969 and 6-58970, a near magnetic field probe is caused to confront a printed circuit board which is installed in an electrical device emitting much unnecessary radiation, the near magnetic field probe is moved in X-Y-Z axial directions with respect to the printed circuit board, and electromagnetic noise is measured based on an output from the near magnetic field probe.

Further, in the disclosure of Japanese Laid-Open Patent publication No. 6-58970, a printed circuit board disposed in an electrical device is placed on an antenna for measuring interference, wherein measurements including electromagnetic noise of surfaces of the printed circuit board are made.

On the other hand, as an interference measuring antenna for detecting a magnetic field of unnecessary radiation, there is the disclosure of Japanese Laid-Open Patent publication No. 6-58971. This interference measurement antenna is made up of a multi-turn coil which is connected in series to a coil constructed as a pattern in the same position atop a multi-layer printed circuit board, wherein a surface-installed condenser is made internal with the printed circuit board, the multi-turn coil and condenser are connected, and an LC resonant circuit is arranged as a matrix on the printed circuit board.

Notwithstanding, apart from the problem that in the measurement of electromagnetic noise by the electromagnetic noise measurement apparatuses of the above-mentioned prior art, measurement of electromagnetic noise covering the GHz band is problematic, there is also the problem that an antenna must be arranged at a predetermined interval in a plane which is wider than the area of the concerned electromagnetic noise measurement body under operation.

Furthermore, because the antenna is arranged in a plane, a distance-based measurement interval is fixed by the distance from the antenna, and measurement resolution cannot be made small.

Still further, the antenna cannot capture, as a near magnetic field, a current which flows through an electronic circuit.

Further, in the disclosures of Laid-Open Patent publication Nos. 6-58969 and 6-58970, because measurements are made while driving the near magnetic field probe in X-Y-Z axial directions, in spite of the fact that the time of electrical measurement is shortened, time is required for mechanical movement of the near magnetic field probe, and there is the problem that high speed measurement is difficult.

Further, in the measurement of electromagnetic noise by the electromagnetic noise measurement apparatuses of the above-mentioned prior art, because a drive motor for moving the near magnetic field probe is always operated, elimination of electromagnetic noise due to the motor becomes necessary and the motor must be distanced from the near magnetic field probe, also resulting in the problem that the apparatus becomes increased in complexity.

Further, when using the interference measurement antenna of the above-mentioned prior art, there is the problem that only electromagnetic noise of a narrow frequency band, in which sensitivity is improved by constructing a resonant circuit, can be measured. For widening the frequency band, it becomes necessary to raise the resonant frequency, however when made small in size with a few MHz frequency band, there is the problem that the sensitivity thereof is diminished.

Furthermore, when using the interference measuring antenna of the above-noted prior art, when the coil number is increased the antenna surface shields the measured electromagnetic noise of concern, and there is also a problem that the direction of the magnetic field components which make up the electromagnetic noise are bent and accurate measurement thereof cannot be conducted.

Moreover, in the electromagnetic noise measurement apparatus of the prior art, apart from electromagnetic noise levels, such apparatuses cannot enable measurement together with measuring the direction of generation of the electromagnetic source.

OUTLINE OF THE INVENTION

A first object of the present invention is to provide an electromagnetic noise measurement apparatus which can take measurements in a wide band GHz range, further wherein accurate measurement of electromagnetic noise levels, combined with direction of the electromagnetic noise generating source, can be performed, and wherein electromagnetic noise levels and the electromagnetic noise generating source can be specified.

A second object of the present invention is to provide an electromagnetic noise measurement apparatus in which resolution of the electromagnetic noise measurement is increased.

A third object of the present invention is to provide an electromagnetic noise measurement apparatus in which the electromagnetic noise levels and direction of the electromagnetic noise generating source can be rapidly measured.

The above and other objects, characteristics and advantages shall be made more clear from the attached figures and accompanying descriptions of the following preferred embodiments.

BRIEF DESCRIPTION OF THE DRAWINGS

FIG. 1 is an outline structural view of an electromagnetic noise measurement apparatus according to a first embodiment of the present invention.

FIG. 5 is a partially cut-away perspective view accompanying a structural description of a shielded loop coil as one example of a coil in the first embodiment of the present invention.

FIG. 6 is a perspective view showing a structure of the base substrate driving apparatus of the electromagnetic noise detecting apparatus according to the first embodiment of the present invention.

FIG. 9 is an outline structural view of an electromagnetic noise detecting apparatus according to a second embodiment of the present invention.

FIG. 11 is a perspective view showing a structure of a base substrate driving device for the electromagnetic noise detecting apparatus in the second embodiment of the present invention.

FIG. 15 is a typical view showing a relationship between the displays of direction of an electromagnetic noise generating source and the electromagnetic noise level which are determined through calculation, in the second embodiment of the present invention.

DESCRIPTION OF THE PREFERRED EMBODIMENTS

Figure 2A:
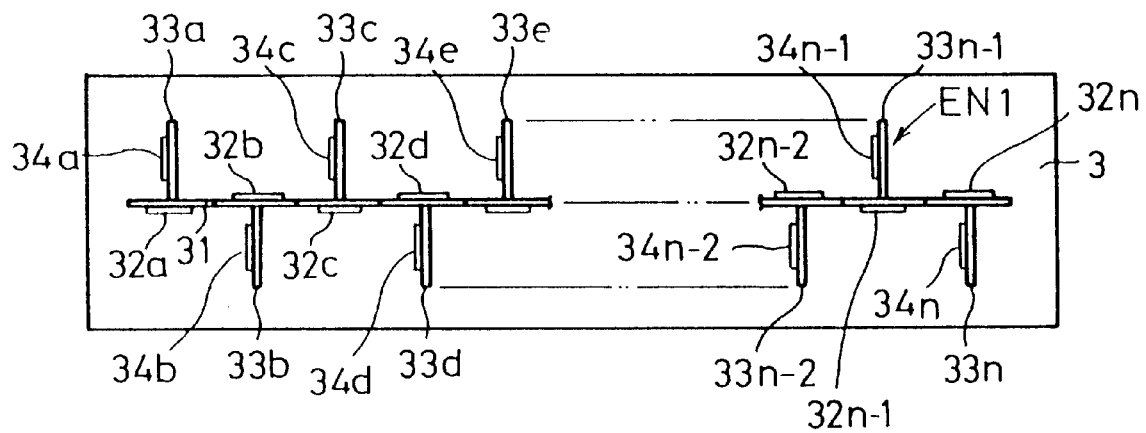
FIG. 2A is a planar view of a base substrate on which an electromagnetic noise sensor (EN1) of the first embodiment of the present invention is disposed.

Below, preferred embodiments of the electromagnetic noise sensor in accordance with the present invention shall be presented, the below detailed description thereof being explained with reference to the attached drawings.

FIG. 1 is an outline structural view of an electromagnetic noise measurement apparatus according to a first embodiment of the present invention, wherein an example of a case in which a two-dimensional planar electromagnetic noise is measured shall be described.

The electromagnetic noise measurement apparatus 1 comprises a base substrate 3 having disposed upright on a first surface thereof an electromagnetic noise sensor EN1 formed from a coil array, and further on a back surface thereof a switch circuit group 2 made up of switches 2a, 2b, . . . (refer to FIG. 6) which separately and selectively deliver out an output from a coil corresponding to coils of the electromagnetic noise sensor EN1, and which constitute the electromagnetic noise sensor EN1; a base substrate driving device 4 for driving the base substrate in Y-axis and X-axis directions; a signal conversion device 5 made up, for example, of a spectral analyzer or network analyzer which constitutes an interface which converts an induced voltage output, via the switching circuit group 2, from the electromagnetic noise sensor EN1, to a signal capable of being read-in by a control circuit 6; a RAM 7 operating cooperatively with the control circuit; and a display device 8 for displaying an electromagnetic noise level and a direction based on the output from the control circuit 6. Further, in FIG. 1, in order to better describe the switching circuit group 2, it is shown as being spaced apart from the base substrate 3.

The switches which constitute the switch group 2 disposed on the back surface of the base substrate 3 correspond to each coil making up the electromagnetic noise sensor EN1, and further are constituted by relays which deliver out separately and selectively an evoked voltage from its corresponding coil. Herein, the relays which make up the switches are wide band mechanical relays set at a characteristic impedance of 50 Ω. Such relays are used because the OFF resistance thereof is substantially infinite. When a slight decrease concerning OFF resistance is acceptable, in place of mechanical relays, diode switching circuits may also be used.

The control apparatus 6, to be discussed later, comprises a drive pulse generating means 61, a switching signal generating means 62, a calculating means 63 and a display control means 64.

The reason for use of the signal conversion device 5 is so that the frequency of the induced voltages output from the coils making up the electromagnetic noise sensor EN1 are frequencies in the GHz band, and so that the high voltage of such frequencies is converted to a signal capable of being read by the control circuit 6.

Further, at least the base substrate 3, the base substrate driving device 4, the control circuit 6 and RAM 7 are disposed in a casing 10 of the electromagnetic noise measurement apparatus 1.

With the electromagnetic noise measurement apparatus 1 of the first embodiment, a concerned electromagnetic noise measurement device to be tested which generates electromagnetic noise, for example an electronic device of a printed circuit board while under operation, is placed on an upper surface of the casing 10 of the electromagnetic noise measurement apparatus 1, wherein a frosted glass substrate 9 is provided as a placement substrate for the electromagnetic noise measurement device to be tested. In place of frosted glass substrate 9, a substrate formed of an acrylic resin, for example, may also be used.

The base substrate 3 is disposed at a fixed interval separation from, and so as to confront, a back surface of the frosted glass plate 9.

In the electromagnetic noise measurement apparatus 1 of the first embodiment of the present invention, the effective area of the frosted glass plate 9 is made JIS (Japanese Industrial Standard) A4 in size.

Figure 2B:
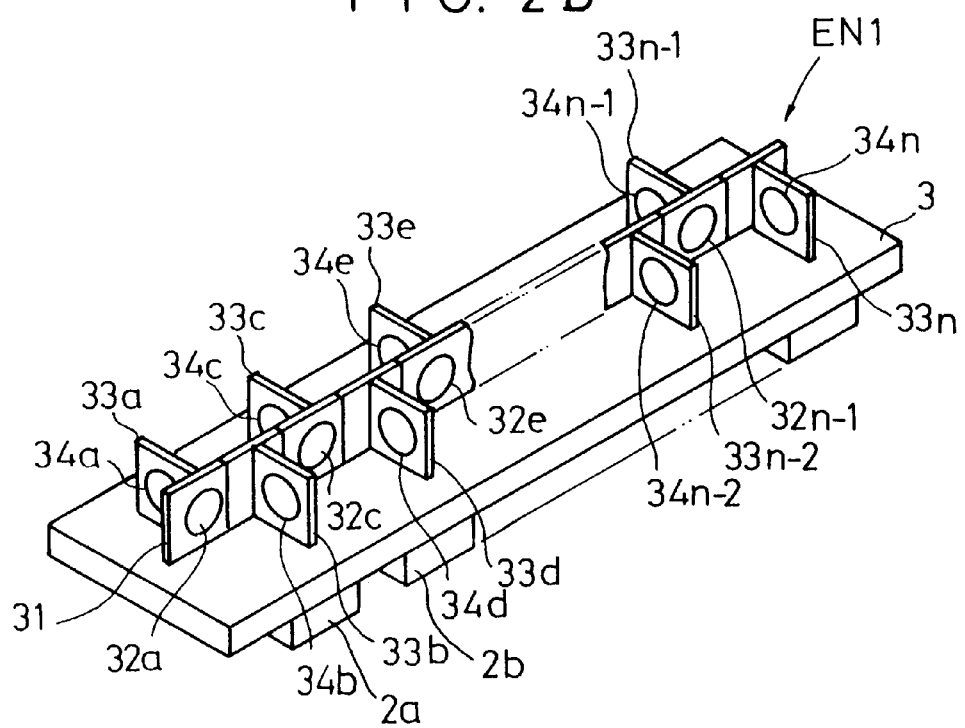
FIG. 2B is a perspective view of a base substrate on which an electromagnetic noise sensor (EN1) of the first embodiment of the present invention is disposed.

The electromagnetic noise sensor EN1 is constructed on a surface of the base substrate 3 which faces the back surface of the frosted glass plate 9, as shown in plan view in FIG. 2A and perspective view in FIG. 2B. In the first embodiment, for the electromagnetic noise sensor EN1 a dielectric substrate 31, for example a Teflon substrate or glass epoxy substrate, is disposed upright on a surface of the based substrate 3. Coils 32a, 32b, . . . 32n are formed, separated at fixed intervals mutually on front and rear surfaces of the dielectric substrate 31, and dielectric substrates 33a, 33b, . . . 33n are separately disposed perpendicularly at central positions of the coils 32a, 32b, . . . 32n on an opposite side surface of the dielectric substrate 31, opposite to a surface of the dielectric substrate 31 which has the coils 32a, 32b, . . . 32n formed thereon. Coils 34a, 34b, . . . 34n are formed on one surface of the dielectric substrates 33a, 33b, . . . 33n, wherein an electromagnetic noise sensor EN1 is made up from the dielectric substrates 31 and 33a, 33b, . . . 33n and coils 32a, 32b, . . . 33n and 34a, 34b, . . . 34n.

In this manner, the coils 32a, 32b, . . . 32n are arranged on the base substrate 3 along the X-axis direction, wherein Y-axis direction noise components, in particular Y-axis direction magnetic field components to be discussed hereinafter, are detected. The coils 34a, 34b, . . . 34n are arranged along the Y-axis direction on the base substrate 3, wherein X-axis direction electromagnetic noise components, in particular X-axis magnetic field components to be discussed hereinafter, are detected.

Figure 3A:
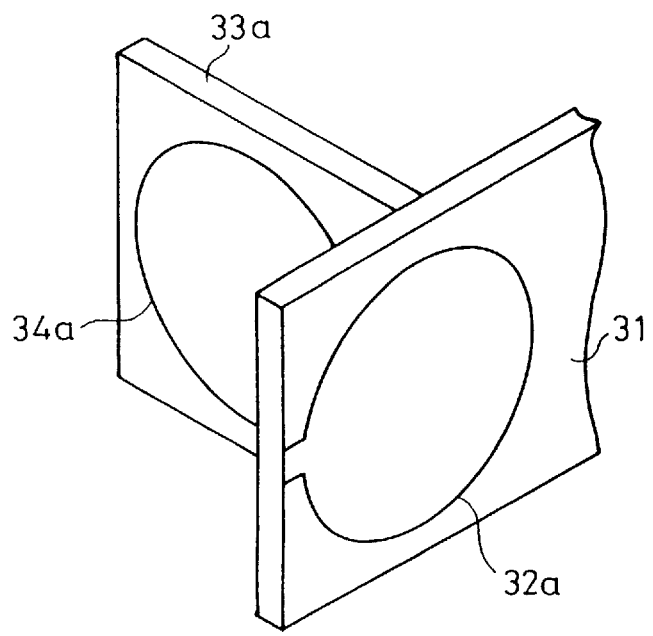
FIG. 3A is a typical perspective view accompanying a description of the principles of detection of an electromagnetic noise level and direction of an electromagnetic noise generating source in the first embodiment of the present invention.

Furthermore, to exemplify the relative positioning of the paired coils 32a and 34a, they are as shown in the perspective view of FIG. 3A.

FIGS. 3B, 3C, 4A and 4B are explanatory views for determining the electromagnetic noise levels and direction of an electromagnetic noise generating source from coils 32a and 34a, wherein to facilitate explanation, the coils 32a and 34a are shown as typical views.

Herein, a distance $A_L$ is defined to be a distance from the surface position of coils 32a, . . . , 32n to a center position A0 of each of corresponding coils 34a, . . . , 34n. Coils 32a, . . . , 32n and 34a, . . . , 34n are formed with a uniform coil winding direction, and are arranged so as to output a positive induced voltage with respect to coordinates determined by the dielectric substrates 31 and 33a, . . . , 33n, and with respect to a magnetic field from a first quadrant side.

When a magnetic field generated by a high frequency current flowing through an electronic circuit of an electromagnetic measurement device under test exists in the vicinity of the dielectric substrate 31, a voltage is induced in the coils 32a, . . . , 32n and 34a, . . . , 34n by the magnetic field. The induced voltage values output based on the induced voltage from coils 32a, . . . , 32n and 34a, . . . , 34n are stored respectively in RAM 7.

Figure 3B:
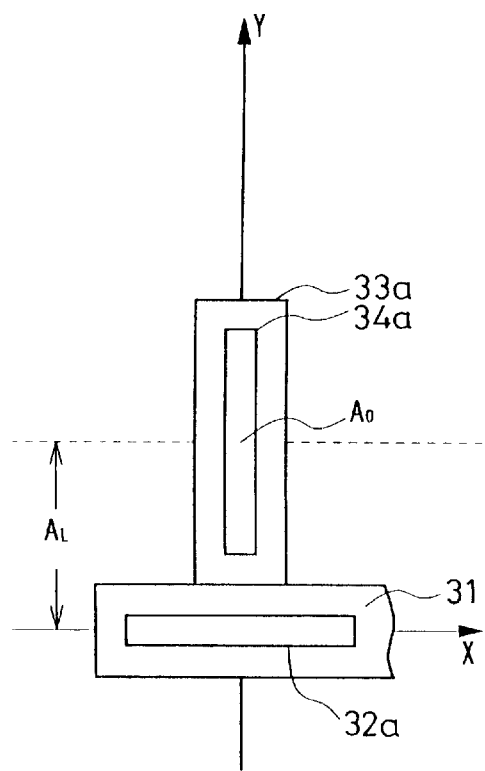
FIG. 3B is a typical view accompanying a description of the principles of detection of an electromagnetic noise level and direction of an electromagnetic noise generating source in the first embodiment of the present invention.

The induced voltage values from coils 32a and 34a, when at the position of the dielectric substrates 31 and 33a shown in FIG. 3B, are stored in RAM 7. The induced voltage value from the coil 34a is defined as ($|V_{X1}|$).

Herein, because the frequency of induced voltages from the coils 32a, 34a are in the GHz band, and a signal conversion is performed by a signal conversion device, such as a spectral analyzer which acts as an interface, and are then read in, the instantaneous polarity thereof is unclear. As a result, for convenience, absolute value symbols || are applied and shown. Such symbols shall be used similarly throughout the following descriptions.

Figure 3C:
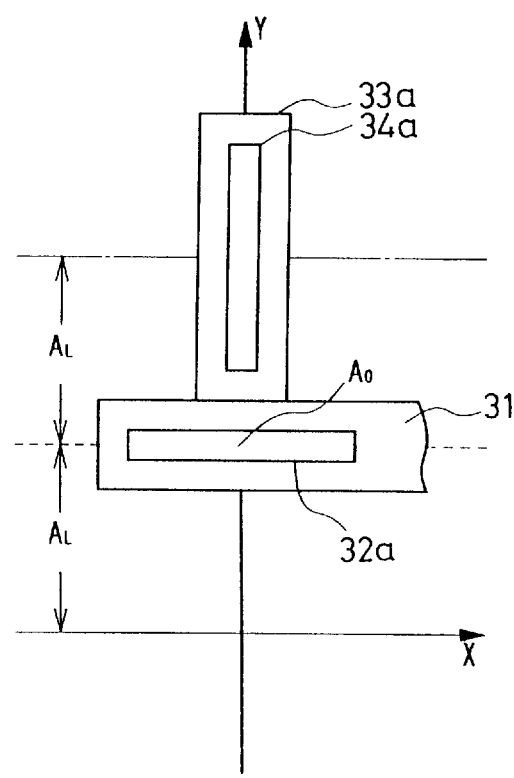
FIG. 3C is a typical view accompanying a description of the principles of detection of an electromagnetic noise level and direction of an electromagnetic noise generating source in the first embodiment of the present invention.

Next, as illustrated in typical view in FIG. 3C, the dielectric substrates 31 and 33a are moved only a distance $A_L$ from the position of FIG. 3B in the Y-axis direction, an induced voltage value output from coils 32a and 34a at the position shown in FIG. 3C is stored in RAM 7, and then the coils 32a and 34a are put in parallel connection, and an induced voltage value in the parallel connected state is stored in RAM 7. The induced voltage value from the coil 32a is defined as ($|V_{y2}|$) and the induced voltage value when in a parallel connected state is defined as ($|V_{p2}|$).

Following storage of the induced voltage values in RAM 7, an induced voltage value ($|V_{x1}|$) from the coil 34a, which is stored when at the condition shown in FIG. 3B, and an induced voltage value ($|V_{y2}|$) from the coil 32a which is stored when at the condition shown in FIG. 3C, are read out from a memory, and calculations of the following equations (1) and (2) are performed.

$$G = \sqrt{(|V\nabla_{x1}|)^2 + (|V_{y2}|)^2} \quad (1)$$

$$An = \mathrm{Arctan}\,(|V_{y2}|)/(|V_{x1}|) \quad (2)$$

Figure 4A:
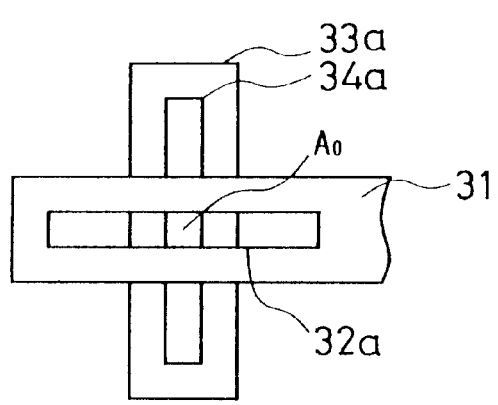
FIG. 4A is an explanatory view accompanying a description of the principles of detection of an electromagnetic noise level and direction of an electromagnetic noise generating source in the first embodiment of the present invention.

At this stage, the relative relationship between the position of the coil 34a shown in FIG. 3B and the position of the coil 32a shown in FIG. 3C is such that coils 32a and 34a have a typically perpendicular positional relationship, as shown in FIG. 4A, taking the center position A0 as an origin point, wherein a magnetic field strength G and magnetic field direction An are determined, at the center position A0, from the induced voltage values ($|V_{y2}|$), ($|V_{x1}|$) and ($|V_{p2}|$).

Equation (1) indicates the magnetic field strength G and equation (2) indicates the magnetic field direction An. When S is taken as the area of a received portion of the magnetic field from coils 32a and 34a, H as the magnetic field strength, and θ as an angle formed between the X-axis and the magnetic field generation point, the induced voltage values Vx and Vy induced in coils 34a and 32a are as follows.

$$Vx = (\mu_0 S)\cdot(dHx/dt)$$

$$Vy = (\mu_0 S)\cdot(dHy/dt)$$

$$Hx = H\cos\theta$$

$$Hy = H\sin\theta$$

Although the magnetic field strength is determinable from equation (1), as stated previously, because the instantaneous polarity of the induced voltage is unclear, it cannot be decided at that time from equation (2) inside of which four quadrants the magnetic field direction is. Next, an explanation shall be given of the induced voltage value ($|V_{p2}|$).

The induced voltage value which is detected by parallel connecting coils 32a and 34a at the position of FIG. 3C, wherein the internal impedance of coils 32a and 34a are set to be roughly equal, is an induced voltage value which is determined based on the polarities at respective instants of the induced voltage of coil 32a and the induced voltage of coil 34a, wherein ($|V_{p2}|$) is roughly equal to ($|V_{x2}+V_{y2}|$).

Figure 4B:
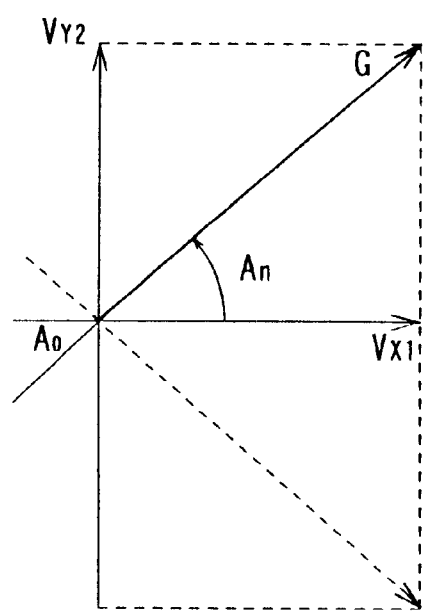
FIG. 4B is an explanatory view accompanying a description of the principles of detection of an electromagnetic noise level and direction of an electromagnetic noise generating source in the first embodiment of the present invention.

Next, the larger value among the induced voltage values ($|V_{y2}|$) and ($|V_{x2}|$) is selected, and it is checked whether the induced voltage value ($|V_{p2}|$) is larger than the larger of the former two voltages. Based on this check, when it is discerned that the induced voltage value ($|V_{p2}|$) is larger than the one discerned to be the larger of the induced voltage values (i.e. the larger of $|V_{y2}|$ and $|V_{x2}|$), the value of the calculation result of equation (2) is taken as the magnetic field direction. When it is discerned, in the above-described check, that the induced voltage value ($|V_{p2}|$) is not larger than the one discerned to be the larger of the induced voltage values (i.e. the larger of $|V_{y2}|$ and $|V_{x2}|$), a value taken by adding 90 degrees to the calculation result of equation (2) is taken as the magnetic field direction. Accordingly, as shown in FIG. 4B, the magnetic field strength G and magnetic field direction can be determined. The broken line in FIG. 4B shows a case in which the magnetic field generation point is in the second quadrant.

This feature shall be described more fully. As for the induced voltage value ($V_{p2}$), when coils 32a and 34a are connected in parallel, in the case that the magnetic field is received from the first or third quadrants, the induced voltage value ($V_{y2}$) from coil 32a and the induced voltage value ($V_{x2}$) from coil 34a are of the same polarity, and ($V_{p2}$) becomes an induced voltage value by adding voltage value ($VY_{y2}$) and voltage value ($V_{x2}$); and in the case that the magnetic field is received from the second or fourth quadrants, the induced voltage value ($V_{y2}$) from coil 32a and the induced voltage value ($V_{x2}$) from coil 34a are of different polarity, and ($V_{p2}$) becomes an induced voltage value by subtracting induced voltage value ($V_{y2}$) from induced voltage value ($V_{x2}$).

Accordingly, when the larger among the induced voltage value ($|V_{y2}|$) and induced voltage value ($|V_{x2}|$) is selected, and the induced voltage value ($|V_{p2}|$) is greater than the larger of the induced voltage values, this implies an addition, and it is discerned that the magnetic field direction is from the first or third quadrant. When the larger amount the induced voltage value ($|V_{y2}|$) and induced voltage value ($|V_{x2}|$) is selected, yet the induced voltage value ($|V_{p2}|$) is not greater than the larger of the induced voltage values, this implies a subtraction and it is discerned that the magnetic field direction is from the second or fourth quadrant. As a result, the magnetic field direction can be easily detected.

Further, in the above, paired coils 32a and 34a have been explained, however the situation is the same in the case of the other paired coils 32b and 34b, 32n and 34n.

The respective coils 32a, 32b, . . . , 32n, 34a, 34b, . . . , 34n are constructed, for example, by shielded loop coils SC, as shown by the partial broken sectional view of FIG. 5.

In each of respective coils 32a, . . . , 32n, 34a, . . . , 34n which are constructed as shielded loop coils SC, a through hole 16 is disposed substantially centrally, and further a notch Gp which communicates the through hole 16 to the outside is disposed, and dielectric substrates 12-1 and 12-2 formed by substantially C-shaped Teflon plates or glass-epoxy resin plates or the like are stacked in relative confronting relation with their mutual through holes 16 and notches Gp in conformity; ground conductors 13-1 and 13-2 are separately formed on outer surfaces of the respective dielectric substrates 12-1 and 12-2; a fixed position interposed by the through hole 16 and opposing the notch GP is taken as a starting terminal position P, and a fixed position on one semicircular C-shaped part is taken as an end terminal position E, wherein the ground conductors 13-1 and 13-2, at the starting terminal position P, are electrically connected to the outer conductor of a co-axial cable 15; a roughly half-turn strip conductor 14, having a characteristic impedance set at 50 Ω, is formed on an inner surface of one dielectric substrate 12-1 from the starting terminal position P along the other C-shaped semicircular part, and across the notch GP and along the one C-shaped semicircular part until reaching the end terminal position E; the respective ground conductors 13-1 and 13-2 are electrically connected with the strip conductor 14 at the end terminal position E, and the starting terminal position P side of the strip conductor 14 is electrically connected to the inner conductor of coaxial cable 15, wherein an induced voltage between the strip conductor 14 and ground conductors 13-1 and 13-2 is taken out and delivered to a switch of the switching circuit group 2.

As a result of the fact that the respective coils 32a, . . . , 32n, 34a, . . . , 34n are constructed as shielded loop coils SC as described above, the strip conductor 14 is gripped in a sandwiched state by the ground conductors 13-1 and 13-2, is shielded from external electric fields and does not receive effects from external electric fields. Further, because the respective ground conductor surfaces of the ground conductors 13-1 and 13-2 are in upper/lower symmetry with respect to a line connecting the notch GP and starting terminal position P of the strip conductor 14, induced voltages from electric fields are differentially suppressed, such induced voltages by electric fields are negated, and induced voltages caused primarily by magnetic fields are taken out from the coils 32a, . . . , 32n, 34a, . . . , 34n, and further the range of measuring frequency can cover up to 2 GHz.

In this way, according to the first embodiment, shielded loop coils SC are used for the coils 32a, 32n, 34a, . . . , 34n, and since electromagnetic noise is caused to be detected by the shielded loop coils SC, electric field components are negated by such shielded loop coils SC, and electric field components are not detected thereby, wherein only magnetic field components caused by changes in electric current changes in an electronic circuit which is the object of a measurement are detected. Accordingly, magnetic fields generated by currents flowing in the electronic circuit, which is the object of measurement, are detected.

In contrast to this, when detecting electromagnetic noise by an antenna, the electromagnetic waves as a result magnetic fields, namely combined electric fields and magnetic fields, are detected. Further, when detected by an antenna, the directivity of the antenna becomes problematic. However, with the first embodiment, because shielded loop coils SC are disposed perpendicularly, such directivity does not cause any problem.

Further, in the shielded loop coils SC, even if the dielectric substrates 12-1 and 12-2 do not have through holes 16, and are formed in a state without through holes 16, this does not interfere in terms of the characteristics thereof.

Next, an explanation shall be given of a base substrate driving apparatus 4. FIG. 6 is a perspective view showing the structure of the base substrate driving apparatus 4.

The base substrate driving apparatus 4 is equipped by a main base 41 which is fixed by a suitable means in a casing; an X-axis direction driving pulse motor 42 affixed to the main base 41; a ball screw 44 disposed atop the main base and which is rotatably driven, through a timing belt 43, by rotation of a rotor of the X-axis direction driving pulse motor 42; and an X-axis direction moving table 47 which is equipped with an enmeshing engagement part which enmeshes with the ball screw 44, which is guided by guides 45 and 46, and is moved in accordance with rotation of the ball screw in the X-axis direction atop of the main base 41, wherein in accordance with rotation of the X-axis direction driving pulse motor 42, the X-axis direction moving table 47 is driven in steps along the X-axis direction.

The base substrate driving apparatus 4 is additionally equipped with a Y-axis direction driving pulse motor 48 which is affixed onto the X-axis direction moving table 47, a ball screw 50 disposed atop the X-axis direction moving table 47 and which is further rotatably driven, through a timing belt 49, by rotation of a rotor of the Y-axis direction driving pulse motor 48; and a Y-axis direction moving table 53 equipped with an enmeshing engagement part which enmeshes with the ball screw 50, which is guided in the X-axis direction by guides 51 and 52, and which is moved by rotation of the ball screw 50 in the Y-axis direction on top of the X-axis direction moving table 47, wherein by rotation of the Y-axis direction driving pulse motor 48, the Y-axis direction moving table 53 is driven in steps in the Y-axis direction.

The base substrate 3, having disposed thereon the electromagnetic noise sensor EN1, is affixed through spacers 54 on a surface side of the Y-axis direction moving table 53, so that the Y-axis direction moving table 53 and the switch circuit group 2 do not abut each other.

As a result of structuring the base substrate moving apparatus 4 as described above, the base substrate 3 is driven in the Y-axis direction, in a state having the electromagnetic noise sensor EN1 installed thereon, in accordance with driving of the Y-axis direction moving pulse motor 48, and the base substrate 3 is driven in the X-axis direction, in a state in which the electromagnetic noise sensor EN1 is installed thereon, by driving of the X-axis direction driving pulse motor 42.

The control circuit 6 is formed by a microcomputer, and is functionally equipped by a drive pulse generating means 61 outputting a driving pulse for driving the X-axis direction driving pulse motor 42 and a Y-axis direction driving pulse for driving the Y-axis direction driving pulse motor 48; a switching signal generating means 62 for delivering out a switching signal to the switch circuit group 2, for successively and selectively conveying out an induced voltage signals from each of the coils; a calculating means 6 for determining, by calculation, a magnetic field strength and magnetic field direction based on the induced voltage values output by the coils; and a display control means 64 for displaying on a display means 8 the magnetic field strength and magnetic field direction corresponding to a position above the region of measurement.

Figure 7:
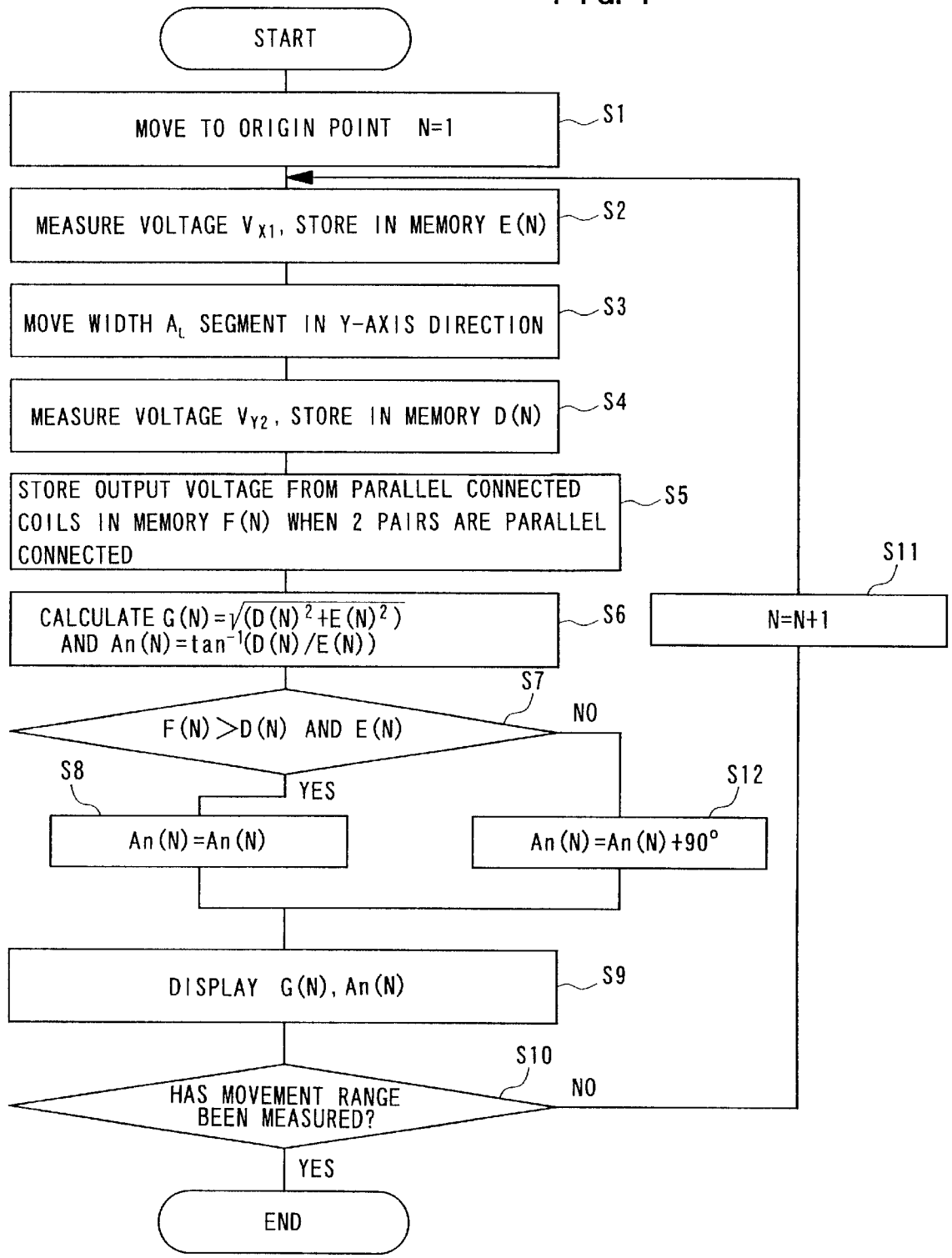
FIG. 7 is a flowchart accompanying a description of the detection operations of an electromagnetic noise level and direction of the electromagnetic noise generating source, in the first embodiment of the present invention.

Operation of the electromagnetic noise measurement apparatus 1 of the first embodiment, constructed as described above, shall be explained based on the flow chart of FIG. 7.

When the electromagnetic noise measurement apparatus 1 is operated in a state in which a magnetic field generating body, for example an electronic device during operation thereof, is placed on the frosted glass plate 9, the base substrate 3 having the electromagnetic noise sensor EN1 installed thereon is moved to a previously determined origin point in accordance with driving pulses output from the X-axis direction driving pulse motor 42 and Y-axis direction driving pulse motor 48, and an initial setting for the number of times of movement thereof, N=1, is made (Step S1).

When the base substrate 3 is positioned at the above-stated origin point, each of induced voltage values $|V_{x1}|$ from each of coils 34a, 34b, . . . 34n in the electromagnetic noise sensor EN1 are stored in an area E(N) of RAM 7 (Step S2), and thereafter the base substrate is moved a distance component $A_L$ in the Y-axis direction (Step S3).

Following Step S3, each of induced voltage values $|V_{y2}|$ are read-in from each of coils 32a, 32b, . . . , 32n in the electromagnetic noise sensor EN1 and stored in area D(N) of RAM 7 (Step S4), mutually paired coils 32a and 34b, 32b and 34b, . . . 32n and 34n in the electromagnetic noise sensor EN1 are connected in parallel, and induced voltage values $|V_{p2}|$ from each of the paired parallel-connected coils are read in and stored in an area F(N) of RAM 7 (Step S5).

Following Step S5, induced voltage values from mutually paired coils 32a and 34a, 32b and 34b, 32n and 34n which are stored in RAM 7 areas D(N) and E(N) are read out, and, as shown below, the magnetic field strength G(N) and magnetic field direction An(N) are calculated (Step S6).

$$G(N) = \sqrt{D(N)^2 + E(N)^2}$$

$$An(N) = \text{Arctan } (D(N)/E(N))$$

Herein D(N) and E(N) indicate induced voltage values which are the content stored in areas D(N) and E(N), which store therein induced voltage values from mutually paired coils 32*a* and 34*a*, coils 32*b* and 34*b*, . . . coils 32*n* and 34*n*, and in Step S6, the magnetic field strength G(N) and magnetic field direction An(N) with respect to the respective pairs of plural paired coils 32*a* and 34*a*, coils 32*b* and 34*b*, . . . coils 32*n* and 34*n*, is determined.

Following Step S6, the induced voltages stored in RAM 7 area F(N) are read out, sizes of the induced voltage values from paired coils 32*a* and 34*a*, coils 32*b* and 34*b*, . . . coils 32*n* and 34*n*, which are the stored content of RAM 7 areas D(N) and E(N), are compared, and it is checked whether the induced voltage value which is the stored content of RAM 7 area F(N), in which induced voltage values at a time when the paired coils are parallel connected are stored, is greater than the larger of the previously compared voltage values (Step S7). Accordingly, such a check is performed with respect to each of the respective plural pairs. Herein, in Step S7 of FIG. 7, the statement "D(N) and E(N)" implies the selected larger item from among the stored content of area D(N) and the stored content of area E(N).

In Step S7, the induced voltage values stored in RAM 7 memory areas D(N) and E(N) are compared, and when it is discerned that the induced voltage value stored in RAM 7 area F(N) is greater than the larger of those compared values, following Step S7, An(N) is taken as the magnetic field direction (Step S8), and G(N) and An(N) are displayed (Step S9). The display, for example, performs a display of length on the display device 8 based on a magnetic field direction An(N) and a magnetic field strength G(N), at a display position corresponding to each of paired coils 32*a* and 34*a*.

Following Step S8, it is checked whether the full movement range across the Y-axis direction has been detected (Step S10), and when it is discerned in Step S10 that a remaining amount still exists, N is incremented by +1 (Step S11) wherein the process is effected again from Step S2 until the full range across the Y-axis direction has been detected.

In Step S7, the induced voltage values stored in RAM 7 areas D(N) and E(N) are compared, and when it is discerned that the induced voltage value stored in RAM area F(N) is not greater than the larger of those compared values, following Step S7 a magnetic field direction An(N) taken by adding 90° to An(N) is determined, and G(N) and An(N) are displayed (Step S9).

Further, in the above, not only the Y-axis direction but also the base substrate 3 may be moved in the X-axis direction in a condition with the electromagnetic noise sensor EN1 installed thereon, wherein the detection range can be further expanded.

With the first embodiment of the present invention, as described above, for detecting induced voltage values ($|V_{p2}|$) in a parallel connected state, a case of moving only a distance $A_L$ has been illustrated, however, it is also acceptable to move only a predetermined distance, such as a distance of $A_L/2$. Further, when moved only a distance of $A_L/2$, a fine pitch in the Y-axis direction can also be detected.

In the first embodiment of the present invention described above, because shielded coil loops which constitute the electromagnetic noise sensor EN1 are employed, the strength of the magnetic field generated from an electric current, more specifically the strength of a magnetic field in the vicinity of an electric current flowing in an electronic circuit, can be detected, wherein compared to the case of detecting an electromagnetic wave, namely composed of electric and magnetic fields as in the case of using an antenna, electromagnetic noise itself can be directly detected. Further, in the case of coils, directivity does not become a problem as it does with an antenna.

Further, the coils which constitute the electromagnetic noise sensor EN1 are disposed as pairs which, on the one hand, are disposed in an X-axis direction and, on the other hand, in the Y-axis direction, and because the base substrate 3, having disposed thereon paired plural coils, is driving by pulse motors, compared to the case of an antenna disposed on a planar measurement surface, the number of coils making up the electromagnetic noise sensor EN1 can be made less, and in addition the base substrate 3 can be moved an interval of for example 0.1 mm, wherein in terms of distance, a measurement interval can be set at an interval of 0.1 mm.

By measuring induced voltages from the paired coils in three times, the electromagnetic noise level and direction of an electromagnet noise source can be measured, and the measurement can be easily performed.

Figure 8:
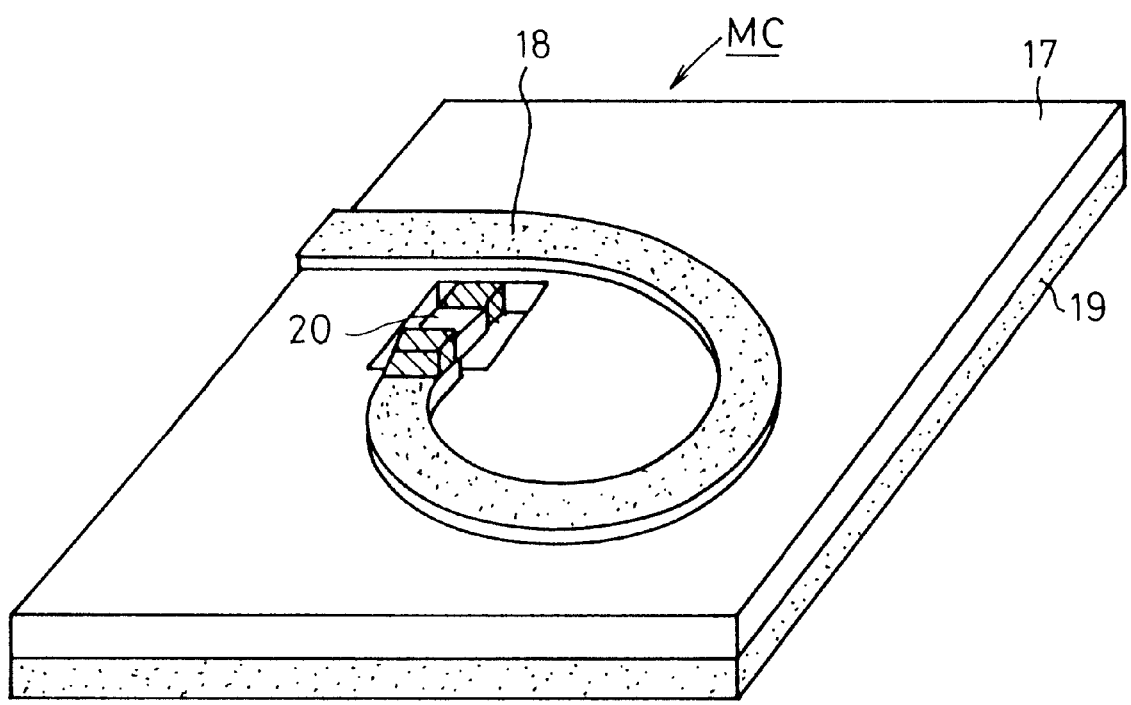
FIG. 8 is a perspective view accompanying a structural description of a microstrip coil as another example of a coil in the first embodiment of the present invention.

Further, in th e first embodiment described above, an example has been given of a case in which shielded loop coils are used for the coils 32*a*, 32*b*, . . . 32*n*, 34*a*, 34*b*, . . . 34*n* which make up the electromagnetic noise sensor EN1, however in place of shielded loop coils, it is also permissible to be constituted by a microstrip coil MC as shown in FIG. 8, as disclosed in Japanese Laid-Open Patent publication No. 8-129058. A coil which is constructed as a microstrip coil MC is formed by approximately one turn on a surface of a dielectric substrate 17, and forms a microstrip conductor 18 having a characteristic impedance of 50 Ω, wherein an ending terminal part of the microstrip conductor 18 electrically interconnects a ground conduct or 19 formed on a back surface of the dielectric substrate 17 and a chip resistor 20 having a characteristic impedance of 50 Ω, and an induced voltage from a starting terminal of the microstrip conductor 18 is delivered out to the switch group 2.

Next, an explanation shall be given of a second embodiment of the present invention.

FIG. 9 is an outline structural view of an electromagnetic noise sensor according to a second embodiment of the present invention.

The electromagnetic noise measurement apparatus 1A according to the second embodiment of the present invention is equipped by a base substrate 3A having disposed upright on a surface thereof an electromagnetic noise sensor EN2 formed from a coil array, and further on a back surface having disposed a switch circuit group 2A formed by switches 2*a*, 2*b*, which correspond to the coils making up the electromagnetic noise sensor EN2, together with separately and selectively deriving outputs of the coils constituting the electromagnetic noise sensor EN2; a base substrate driving device 4A for driving the base substrate 3A in a Y-axis direction and an X-axis direction; a signal conversion device 5 made up, for example, by a spectral analyzer or network analyzer which constitutes an interface for converting an induced voltage output from the electromagnetic noise sensor EN2, via the switching circuit group 2A into a signal which can be read by a control circuit 6A; a RAM 7 operating in cooperation with the control circuit 6A, and a display device 8 for displaying an electromagnetic noise level and direction based on outputs from the control circuit 6A. Further, in FIG. 9, in order to facilitate explanation, the switch circuit group 2A is shown distanced from the base substrate 3A.

The control circuit 6A, as discussed hereinafter, comprises a drive pulse generating means 61A, a switching signal generating means 62A, a calculating means 63A and a display control means 64A.

In the present second embodiment as well, the switches disposed on the back surface of the base substrate 3A correspond to each of the coils making up the electromagnetic noise sensor EN2, and further are constituted by relays which derive out separately and selectively respective induced voltages from the corresponding coils. Herein, the relays which make up the switches are wide band mechanical relays set at a characteristic impedance of 50 Ω. Such relays are used because the off resistance thereof is substantially infinite. When a slight decrease concerning OFF resistance is acceptable, in place of mechanical relays, diode switching circuits may also be used.

The reason for use of the signal conversion device 5 is so that the frequency of the induced voltage output from the coils making up the electromagnetic noise sensor EN2 is a frequency in the GHz band, and so that the high voltage of such frequency is converted to a signal capable of being read by the control circuit 6A.

Further, at least the base substrate 3A, the base substrate driving device 4A, the control circuit 6A and RAM 7 are disposed in a casing 10 of the electromagnetic noise measurement apparatus 1A.

With the electromagnetic noise measurement apparatus 1A of the present embodiment, a frosted glass plate 9 for placement of a concerned electromagnetic noise measurement device to be tested, for example an electronic device of a printed circuit board 3A while under operation, is arranged on an upper surface of the casing 10 of the electromagnetic noise measurement apparatus 1A. In place of the frosted glass plate 9, a substrate formed of an acrylic resin, for example, may also be used.

The base substrate 3A is disposed at a fixed interval separation from, and so as to confront, a back surface of the frosted glass plate 9.

In the electromagnetic noise measurement apparatus 1A of the second embodiment of the present invention, the effective area of the frosted glass 9 is made JIS (Japanese Industrial Standard) A4 in size.

Figure 10A:
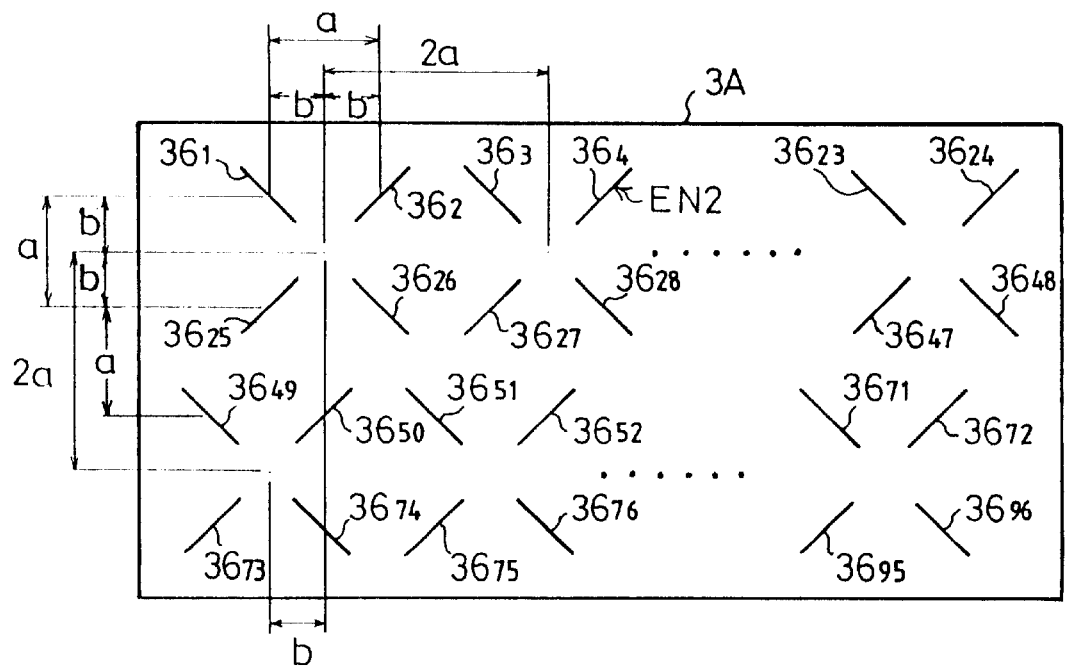
FIG. 10A is a plan view of a base substrate on which electromagnetic noise sensors (EN2) of the second embodiment of the present invention are disposed.
Figure 10B:
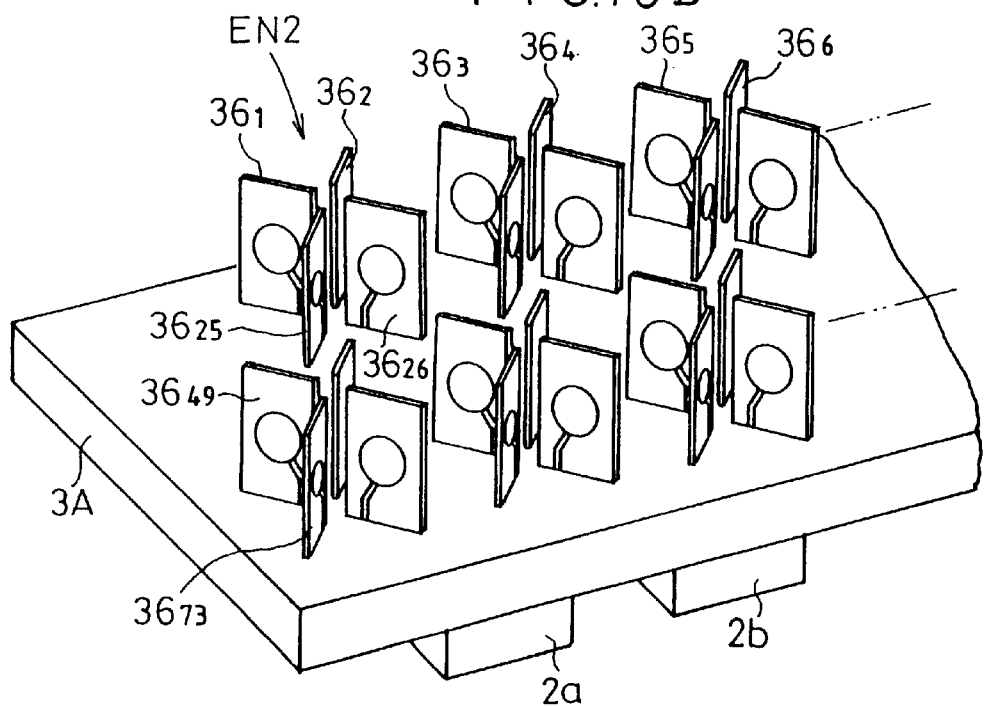
FIG. 10B is a perspective view of a base substrate on which electromagnetic noise sensors (EN2) of the second embodiment of the present invention are disposed.
Figure 12:
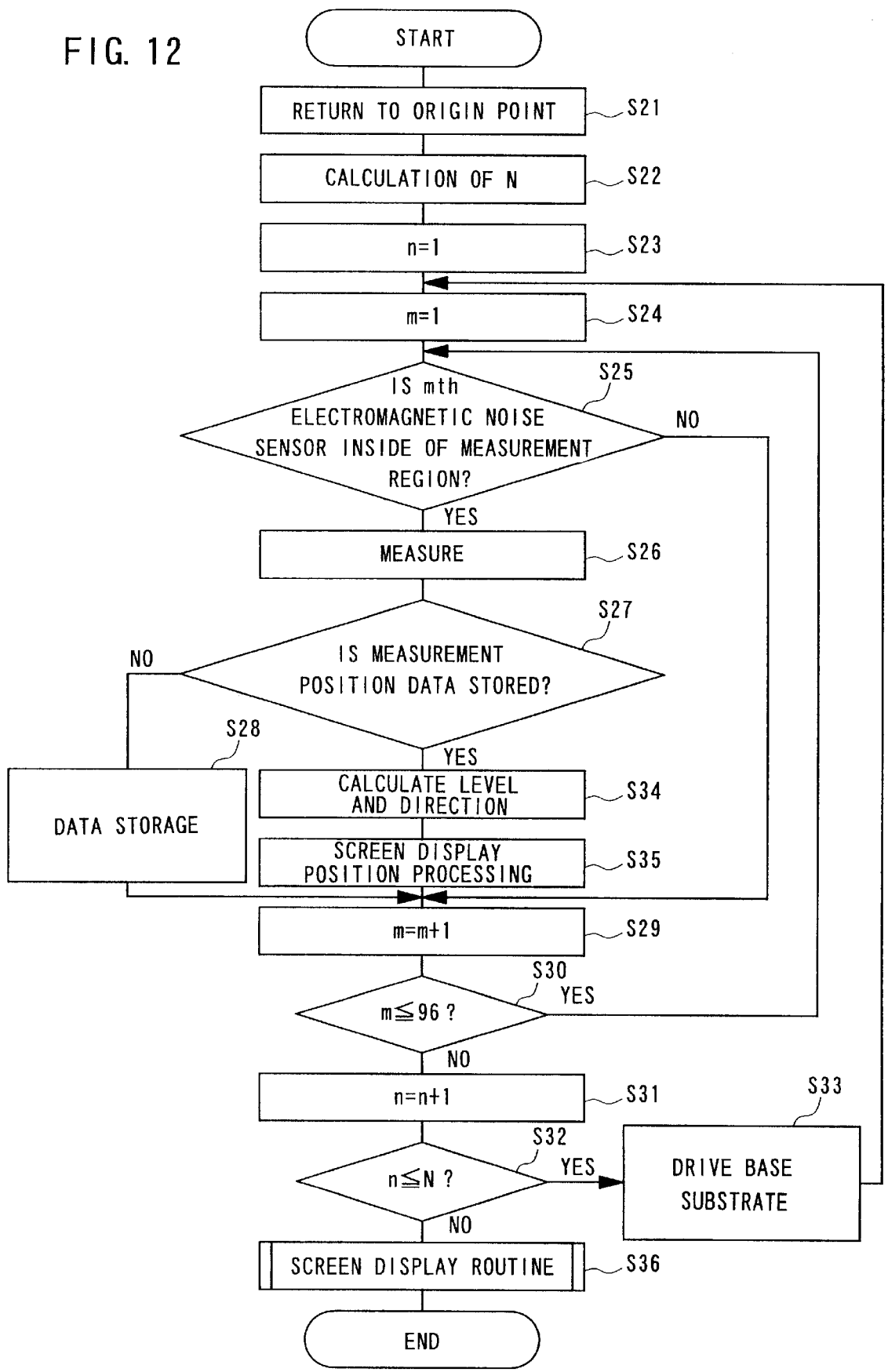
FIG. 12 is a flowchart accompanying explanation of detection operations for the electromagnetic noise level and a direction of the electromagnetic noise generating source, according to the second embodiment of the present invention.

As shown by the plan view of FIG. 10A and perspective view of FIG. 10B, the electromagnetic noise sensor EN2 is constructed upright on a surface of the base substrate 3A which faces the rear surface of the frosted glass plate 9. In the present second embodiment, the electromagnetic noise sensor EN2 is formed from 96 individual coils, which are divided into four rows of 24 each.

In the first row of the electromagnetic noise sensors EN2, coils $36f$ (f=1, . . . , 24) which are arranged mutually at roughly 135° angles and roughly 45° angles, and further wherein central interval distances thereof are separated an interval $\underline{a}$ in the X-axis direction (a=2b, wherein b is a real number) are disposed upright on the base substrate 3A. This row of electromagnetic noise sensors is referred to as the first electromagnetic noise sensor row EN2$f$. Similarly, in the second row of electromagnetic noise sensors EN2, coils $36g$ (g=25, . . . , 28) which are arranged at roughly 225° angles and −45° angles, which are spaced a distance $\underline{a}$ between a central line thereof and an X-axis direction central line of the first electromagnetic noise sensor row EN2$f$, and further which face the coils of the first electromagnetic noise sensor row EN2$f$, are disposed upright on the base substrate 3A. This row of electromagnetic noise sensors is indicated as the second electromagnetic noise sensor row EN2$g$. Further, in the perspective view of FIG. 10B, for ease of explanation, each coil is shown separated by a given distance.

More specifically, coils which are mutually adjacent in row and column directions and which constitute the first and second electromagnetic noise sensor rows EN2$f$ and EN2$g$ are set with respective enclosed angles thereof at 90° and further, wherein each grouping of four individual coils which have a central interval thereof separated by a distance a and being arranged in an X pattern, are arranged upright on the base substrate 3A, so that intervals of each of the centers of pairs thereof are separated by a distance $2\underline{a}$ in plural X-axis directions.

Further, similarly, coils $36h$ (h=49, . . . , 72) which are arranged at roughly 1350 angles and roughly 45° angles, are separated by a distance a of the interval between a center line thereof and the center line of the second electromagnetic noise sensor row EN2$g$, and further which are offset by an interval $\underline{b}$ in the -X-axis direction with respect to coils $36g$ of the second electromagnetic noise sensor row EN2$g$, are disposed upright on the base substrate 3A. The coils $36h$ of this row are referred to as the third electromagnetic noise sensor row EN2$h$. Similarly, coils $36i$ (i=73, . . . , 96) which are arranged at roughly 225° angles and roughly −45° angles, which are separated by an interval a of a center line thereof and the X-axis center line of the third electromagnetic noise sensor row EN2$h$, and further which are in confronting relation with respect to the coils of the third electromagnetic noise sensor row EN2$h$, are disposed upright on the base substrate 3A. This row of electromagnetic noise sensors EN is indicated as the fourth electromagnetic noise sensor row EN2$i$.

More specifically, coils which are mutually adjacent in row and column directions and which constitute the third and fourth electromagnetic noise sensor rows EN2$h$ and EN2$i$ are set with respective enclosed angles thereof at 90° and further, wherein each grouping of four individual coils which have a central interval thereof separated by a distance a and being arranged in an X pattern, are arranged upright on the base substrate 3A so that intervals of each pairs of centers thereof are separated by a distance $2\underline{a}$ *in plural X-axis directions, and further are offset by a distance $\underline{bin}$ the -X-axis direction with respect to the electromagnetic noise sensors EN2 constituting the second electromagnetic noise sensor row EN2g.*

Coils $36_1$ to $36_{96}$ are constituted by the shielded loop coils SC shown in FIG. 5.

Each of coils $36_1$ to $36_{96}$, in place of shielded loop coils, may also be constructed as microstrip coils, as shown in FIG. 8.

Next, the base substrate driving apparatus 4A is constructed as shown in FIG. 11, and has a structure basically the same as the base driving apparatus 4 shown in FIG. 6, however, in place of the base substrate 3, the base substrate 3A is driven.

As a result of structuring the base substrate driving apparatus 4A as discussed above, the base substrate 3A is driven in the Y-axis direction by the Y-axis direction driving pulse motor 48, and the base substrate 3A is driven in the X-axis direction by the X-axis direction driving pulse motor 42.

The control circuit 6A comprises a microcomputer, and is functionally equipped by a drive pulse generating means 61A outputting driving pulses for driving the X-axis direction driving pulse motor 42 and Y-axis direction driving pulses for driving the Y-axis direction drive pulse motor 48; a switching signal generating means 62A for transmitting switching signals to switches 2a, 2b, . . . of the switch circuit group 2A, which serve to derive selectively and sequentially induced voltages from coils $36_1$ to $36_{96}$ which constitute the electromagnetic noise sensor EN2; a calculating means 63A for determining an electromagnetic noise level and a direction of the electromagnetic noise generating source, based on induced voltages output from the coils $36_1$ to $36_{96}$ making up the electromagnetic noise sensor EN2; and a display control means 64A for displaying on a display device 8 the electromagnetic noise level and direction of the electromagnetic noise generating source determined by the calculating means 63A corresponding to a position above a region of measurement.

Operation of the electromagnetic noise measurement apparatus 1A of the second embodiment of the present invention, constructed as described above, shall be explained based on FIG. 12 through FIG. 16C.

Under a condition in which a concerned electromagnetic noise measurement device under test, for example a computer printed circuit board or the like while under operation, is placed on the frosted glass plate 9, when the electromagnetic noise measurement apparatus 1A according to the second embodiment of the present invention is operated, the X-axis direction driving pulse motor 42 and the Y-axis direction driving pulse motor 48 are driven by drive pulses output from the drive pulse generating means 61A, wherein the base substrate 3A is moved to a predetermined origin position, for example, until an end position of the coils $36_1$ to $36_{24}$ of the first electromagnetic noise sensor row EN2$f$ reaches a lower end position of an A4 sized region, and a line of extension from a left end position of the coil $36_{49}$ on the left end of the third electromagnetic noise sensor row EN2$h$ is positioned along a left end of the A4 sized region (Step S21).

After positioning at the above-mentioned origin position, the base substrate 3A is moved sequentially in the Y-axis direction, wherein a measurement range is from where the coils $36_{73}$ to $36_{96}$ of the fourth electromagnetic noise sensor row EN2$i$ extend outside of an upper end side of the A4 sized region.

When the base substrate 3A is moved to the origin position, following Step S21, the maximum number of shift times in the Y-axis direction (N=Ymax÷a+3) is determined (Step S22). Herein, Ymax indicates the length in the Y-axis direction which, in the case of an A4 size, is 210 mm, a is the distance of the center interval of adjacent coils in the Y-axis direction, and "3" is a value so that the coils $36_{73}$ to $36_{96}$ of the fourth electromagnetic noise sensor row EN2$i$ can measure inside an upper end of the measurement region. When the quotient of Ymax÷a is not an integer, the quotient is made ⌈Ymax÷a⌋+1 wherein the symbols ⌈⌋ indicate gauss's notations.

Following step 22, the Y-axis direction shift number n is set at n=1 (Step S23) and next the coil number m of coils making up the electromagnetic noise sensor EN2 is set at 1 (Step S24). Herein, the coil number m of coils constituting the electromagnetic noise sensor EN2, at a maximum, is m=92 (24 of each row of electromagnetic noise sensors X 4 rows) Following Step S24, it is checked whether the mth electromagnetic noise sensor EN is positioned inside of the measurement region or not (Step S25), and when it is discerned that the mth electromagnetic noise sensor EN is positioned inside the measurement region, following Step S25, the switch 2 m of switch group 2A corresponding to the mth coil 36$m$ (m=1 to 96) is placed in an ON state by a switching signal output from the switching signal generation means 62A, and the induced voltage of the mth coil 36m is measured (Step S26).

Following Step S26, it is checked whether or not measurement data is already stored in the RAM 7 address position corresponding to the position inside the region of the mth coil 36$m$ (Step S27). In Step S27, as discussed below, with respect to induced voltages from coils of the odd-numbered electromagnetic noise sensor rows EN2$f$, EN2$h$, it is discerned that the measurement data is not already stored in Step S26, and with respect to induced voltages from the sensors of even-numbered electromagnetic noise sensor rows EN2$g$, EN2$i$, it is discerned that the measurement data is already stored in Step S26.

When the mth coil 36$m$ is a coil of an odd numbered electromagnetic row (EN2$f$, EN2$h$), the induced voltage output from the mth coil 36$m$ is stored as measurement data at an address position of RAM 7 corresponding to a position of the mth coil (Step S28), and next, m is incremented (m=m+1) (Step S29). Next, it is checked whether or not m is 96 or less (Step S30). The execution of Step S30 is for checking whether or not Steps S25 through S29 have been effected across all coils.

When it is discerned that m is 96 or less in Step S30, the steps from S25 are repeatedly executed. During execution of these repeated steps, when m reaches m=25, at that condition, because the mth coil 36$m$ does not enter inside of the measurement region in Step S25, steps S26 to S28 are skipped, and Step 29 is immediately executed after Step S25. Direct execution of Step S29 after Step S25 is performed from the 25th coil $36_{25}$ until reaching coil $36_{96}$. More specifically, when only the first electromagnetic noise sensor row EN2$f$ is inserted into the measurement region, after Step S25, Step S29 is directly executed with respect to coils $36_{25}$ through $36_{96}$ of the second, third and fourth electromagnetic noise sensor rows EN2$g$, EN2$h$ and EN2$i$.

When it is discerned in Step S30 that m exceeds 96, following Step S30 n is incremented n=n+1 (Step S31) and it is checked whether or not n is N or less (Step S32). When it is discerned that n is N or less in Step S32, namely when it is discerned that coils $36_{73}$ through $36_{96}$ of the fourth electromagnetic noise sensor row EN2$i$ are not projecting outside of the measurement region, the Y-axis direction pulse motor 48 is driven in accordance with a driving pulse output from the drive pulse generating means 61A, and the base substrate 3A is driven only a distance a in the Y-axis direction (Step S33), and thereafter the steps from Step S24 onward are repeated.

Just before the first execution of Step S33, the positional relationship between the measurement region and the coils $36_1$ through $36_{24}$ of the first electromagnetic noise sensor row EN2$f$ is as shown typically in FIG. 14A, wherein the coils $36_1$ through $36_{24}$ of the first electromagnetic noise sensor row EN2$f$ are inserted inside the measurement region, and with respect to each of coils $36_1$ through $36_{24}$ of the first electromagnetic noise sensor row EN2$f$ which are at this position, they are indicated from the left as ENa2$f$ (f=1, 2, . . . , 24).

In accordance with having executed Step S33, the positional relationship between the measurement region and the first and second electromagnetic noise sensor rows EN2$f$ and EN2$g$ is as shown in FIG. 14B, wherein the coils $36_1$ through $36_{48}$ of the first and second electromagnetic noise sensor rows EN2$f$ and EN2$g$ become inserted into the measurement region (Step S25), and once again, measurement of induced voltages from the first coil 36$i$ are performed (Step S26). With respect to each of coils $36_1$ through $36_{24}$ of the first electromagnetic noise sensor row EN2$f$ which are at this position, they are indicated from the left as EN2$bf$ (f=1, . . . , 24), and the position of each of coils $36_{25}$ through $36_{48}$ of the second electromagnetic noise sensor row EN 2$g$ are indicated from the left as EN2$bg$ (g=25, . . . , 48). Because they are positioned within FIG. 14B, the reference symbol b has been added.

In Step S36, induced voltage measurements are performed once again successively from the first electromagnetic noise sensor EN. As the time of this execution, because the position of coils $36_1$ through $36_{24}$ of the first electromagnetic noise sensor row EN2f are moved only by a distance a in the Y-axis direction, it is discerned in Step S27 that the measurement data is not recorded (Step S27), and following step S27, Step S28 is executed. In Step S28, the induced voltage output from the mth electromagnetic noise sensor is stored as measurement data in RAM 7, and Steps S29, S30, S25, S26 and S27 are repeatedly executed.

In the course of this execution, measurement of induced voltages from coils of the second electromagnetic noise sensor row EN2g, from the time that the mth coil $36m$ becomes $36_{25}$, are entered into. Nevertheless, as made clear from FIG. 14B, because, at the measurement position of coils $36_{25}$ through $36_{48}$ of the second electromagnetic noise sensor row EN2g, induced voltages output from coils $36_1$ through $36_{24}$ of the first electromagnetic noise sensor row EN2f have already been stored as measurement data in RAM 7, the induced voltages output from coils $36_{25}$ through $36_{48}$ of the second electromagnetic noise sensor row EN2g are not stored as measurement data in RAM 7, and following Step S27, based on the measurement data of the coils corresponding to the first electromagnetic noise sensor row EN2f and the measurement data of coils corresponding to the second electromagnetic noise sensor row EN2g, the electromagnetic noise level and direction θ of the electromagnetic noise generating source are calculated by the calculating means 63A (Step S34). Herein, the electromagnetic noise level, more specifically the voltage induced by coils, is based on a change in the magnetic flux number linked to the electromagnetic noise sensor EN, and further the direction of the electromagnetic noise generating source is based on a flux orientation with respect to the coils.

At this state in Step S34, e.g., the measurement data of corresponding coil $36_1$ of the first electromagnetic sensor row EN2f and the measurement data of the coil $36_{25}$ of the second electromagnetic noise sensor row EN2g are used for the calculation, wherein the positions of coils $36_1$ and $36_{25}$ which output corresponding measurement data accompanying the calculation are in a substantially perpendicular overlapping state, wherein taking measurement data of the coil $36_1$ disposed at a roughly 135° orientation as a and measurement data of corresponding coil $36_{25}$, namely the coil $36_{25}$ disposed at a −135° orientation, as β, the electromagnetic noise level is determined from the calculation of $\sqrt{(\alpha^2+\beta^2)}$, the direction of the electromagnetic noise generating source θ is determined from the calculation of arctan $(\alpha/\beta)$, and the determined electromagnetic noise level and direction θ of the electromagnetic noise generating source are stored.

Handling of the other corresponding coils $36_2$ and $36_{26}$, $36_3$ and $36_{27}$, . . . , $36_{24}$ and $36_{48}$ is the same.

Following Step S34, based on the stored electromagnetic noise level and direction θ of the electromagnetic noise generating source, screen display position processing is performed in Step S35. Such screen display position processing in Step S35 involves a process whereby the electromagnetic noise level data and electromagnetic noise generation source direction data determined in Step S34 are stored at an address position of RAM 7 which corresponds to position coordinates (X, Y) for screen displaying the electromagnetic noise level data and electromagnetic noise generating source direction data. X indicates a value corresponding to a position of the electromagnetic noise sensor in the electromagnetic noise sensor column, and Y indicates the times of driving in the Y-axis direction.

Following Step S35, Steps S29 and S30 are executed. After completion of calculation processing in Step S35 with respect to measurement data output from the last coil $36_{48}$ of the second electromagnetic noise sensor column EN2g, the area outside of the measurement region is discerned in Step S25 which follows step S30, and concerning coils $36_{49}$ through $36_{96}$ of the third and fourth electromagnetic noise sensor rows EN2h and EN2i, Steps S25 through S29 are directly executed, and when it is discerned that m=96 or above in Step S30, Step S33 is executed.

In this condition, in accordance with the execution of Step S33, the positional relationship between the measurement region and coils $36_1$ through $36_{72}$ of the first, second and third electromagnetic noise sensor rows EN2f, EN2g and EN2i becomes as shown in FIG. 14C, and Step S24 and Step S25 are executed. In this state, each of coils $36_1$ through $36_{72}$ of the first, second and third electromagnetic noise sensor rows EN2f, EN2g and EN2i are inserted inside the measurement region (Step S25), and once again the induced voltages from the first coil $36_1$ are measured (Step S26). Each of the coils $36_1$ through $36_{24}$ of the first electromagnetic noise sensor row EN2f, which are in this position, are indicated from the left by EN2cf (f=1, . . . , 24), position of each of the coils $36_{25}$ through $36_{48}$ of the second electromagnetic noise sensor row EN2g are indicated from the left by EN2cg (g=25, . . . , 48), and positions of each of the coils $36_{49}$ through $36_{72}$ of the third electromagnetic noise sensor row EN2h are indicated from the left by EN2ch (h=49, . . . , 72).

In Step S26, once again induced voltages are measured successively from the first coil $36_1$. At the time of this execution, the data from the coils $36_1$ through $36_{24}$ of the first electromagnetic noise sensor row EN2f are stored in RAM 7, and as for measurement data from each of coils $36_{25}$ through $36_{48}$ of the second electromagnetic noise sensor row EN2g, the electromagnetic noise level and direction θ of the electromagnetic noise generating source are determined based together with the coils $36_1$ through $36_{24}$ of the first electromagnetic noise sensor row EN2f which correspond thereto (Step S34), and then screen display position processing is performed (Step S35). Next, the measurement data of each of coils $36_{49}$ through $36_{72}$ of the third electromagnetic noise sensor row EN2h are stored in RAM 7. When the measurement data of the last coil $36_{72}$ of the third electromagnetic noise sensor row EN2h has been stored in RAM 7, in accordance with the execution of Step S29 and Step S30 which are subsequently executed, because coils $36_{73}$ through $36_{96}$ of the fourth electromagnetic noise sensor row EN2g are outside the measurement region, Step S29 is executed directly after Step S25, and in Step S30 when it is discerned that m=96 or above, Step S32 and Step S33 are executed.

In this state, in accordance with execution of Step S33, the positional relationship between the measurement region and the first through fourth electromagnetic noise sensor rows EN2f, EN2g, EN2h and EN2i become as shown in FIG. 14D, and Step S24 and Step S25 are executed. In this state, coils $36_1$ through $36_{96}$ of the first through fourth electromagnetic noise sensor rows EN2f through EN2i become inserted inside of the measurement region (Step S25) and once again induced voltages are measured from the first coil $36i$ (Step S26). Each of the coils $36_1$ through $36_{24}$ of the first electromagnetic noise sensor row EN2f are indicated from the left by EN2df (f=1, . . . , 24), each of the coils $36_{25}$ through $36_{48}$ of the second electromagnetic noise sensor row EN2g are indicated from the left by EN2dg (g=25, . . . , 48), each of the coils $36_{49}$ through $36_{72}$ of th e third electromagnetic noise sensor row EN2h are indicated from th e left by EN2dh (h=49, . . . , 72), and each of the coils $36_{73}$ through $36_{96}$ of the fourth electromagnetic noise sensor row EN2$i$ are indicted from the left by EN2$di$ ($i$=73, ..., 96).

In Step S26, induced voltages from the first coil $36_1$ are again successively measured. At the time of this execution, measurement data for each of coils $36_1$ through $36_{24}$ of the first electromagnetic noise sensor row EN2$f$ are stored in RAM 7, and as for measurement data from each of coils $36_{25}$ through $36_{48}$ of the second electromagnetic noise sensor row EN2$g$, the electromagnetic noise level and direction θ of the electromagnetic noise generating source are determined based together with the coils $36_1$ through $36_{24}$ of the first electromagnetic noise sensor row EN2$f$ which correspond thereto (Step S34), and then screen display position processing is performed. Measurement data for each of coils $36_{49}$ through $36_{96}$ of the third electromagnetic noise sensor row EN2$h$ are stored in RAM 7, and as for measurement data from each of coils $36_{73}$ through $36_{96}$ of the fourth electromagnetic noise sensor row EN2$i$, the electromagnetic noise level and direction θ of the electromagnetic noise generating source are determined based together with the coils $36_{49}$ through $36_{72}$ of the third electromagnetic noise sensor row EN2$h$ which correspond thereto (Step S34), and then screen display position processing is performed. According to execution of the following Step S29 and Step S30, because the coils $36_{73}$ through $36_{96}$ of the fourth electromagnetic noise sensor row EN2$i$ are inside of the measurement region, upon completion of processing corresponding to the last coil $36_{96}$ of the fourth electromagnetic noise sensor row EN2$i$, Step S29, Step S30, Step S31 and Step S32 are executed, and thereafter Step S33 is executed.

In accordance with the execution of Step S33, in this state, the positional relationship between the measurement region of the first through fourth electromagnetic noise sensor rows EN2$f$ through EN2$i$, becomes as shown in FIG. 14E, and Step S24 and Step S25 are executed. At this state, each of coils $36_1$ through $36_{96}$ of the first through fourth electromagnetic noise sensor rows EN2$f$ through EN2$i$ become inserted inside the measurement region, and the steps are effected successively, similarly to the case based on FIG. 14D.

From hereon operations are performed similarly, and continue until each of coils $36_{73}$ through $36_{96}$ of the fourth electromagnetic noise sensor row EN2$i$ protrude outside the measurement region. When it is discerned in Step S32 that n exceeds N, namely when it is discerned that coils $36_{73}$ through $36_{96}$ of the fourth electromagnetic noise sensor row EN2$i$ protrude outside the measurement region, following Step S32 the screen display routine (Step S36) is executed.

In the display of Step S36, a color display which corresponds to the determined electromagnetic noise level is performed, wherein the display of the direction θ of the electromagnetic noise generating source, as shown in FIG. 15, displays a line segment having a predetermined orientation corresponding to the determined direction θ of the electromagnetic noise generating source.

Figure 13:
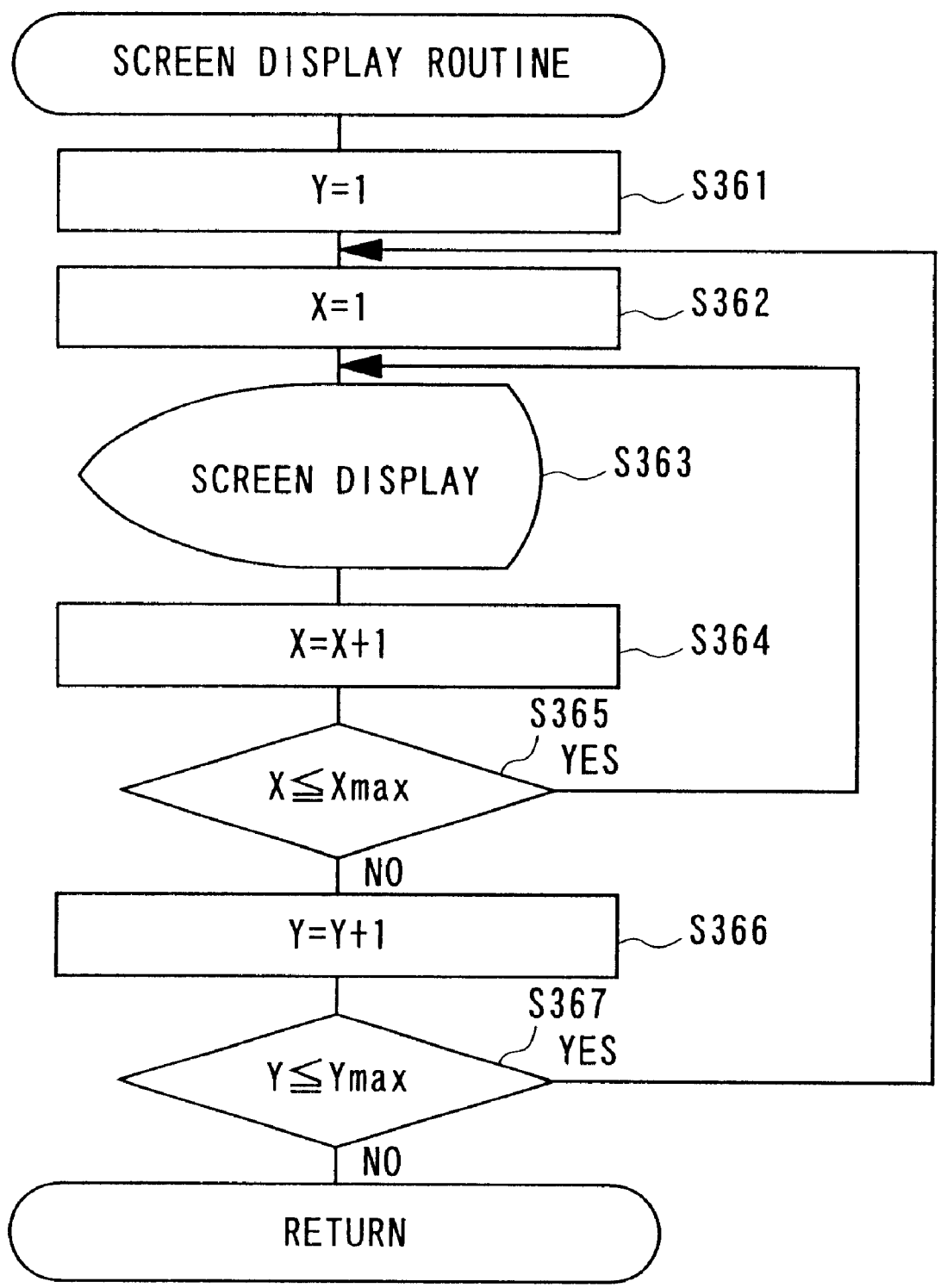
FIG. 13 is a flowchart accompanying explanation of displaying the electromagnetic noise level and direction of the electromagnetic noise generating source, according to the second embodiment of the present invention.
Figure 14:
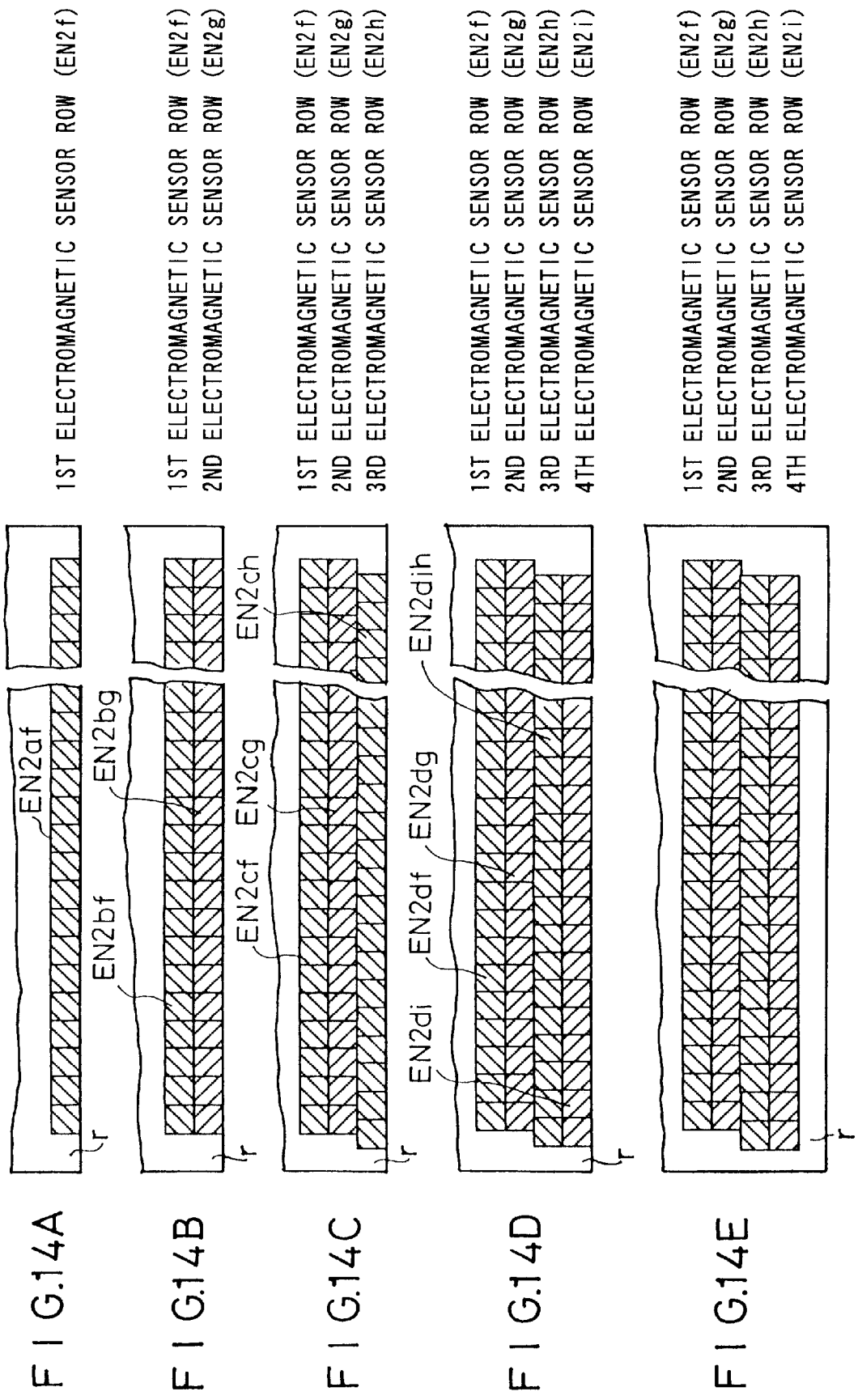
FIG. 14A is a typical view accompanying the explanation of a positional relationship between an electromagnetic noise level according to a Y-axis step movement, and a measurement region, in the second embodiment the present invention.
FIG. 14B is a typical view accompanying the explanation of a positional relationship between an electromagnetic noise level according to a Y-axis step movement, and a measurement region, in the second embodiment the present invention.
FIG. 14C is a typical view accompanying the explanation of a positional relationship between an electromagnetic noise level according to a Y-axis step movement, and a measurement region, in the second embodiment the present invention.
FIG. 14D is a typical view accompanying the explanation of a positional relationship between an electromagnetic noise level according to a Y-axis step movement, and a measurement region, in the second embodiment the present invention.
FIG. 14E is a typical view accompanying the explanation of a positional relationship between an electromagnetic noise level according to a Y-axis step movement, and a measurement region, in the second embodiment the present invention.

Next, a screen display routine in Step S36 is described based on the flowchart in FIG. 13.

When the screen display routine is entered into, a display control is performed based on the control of the display control means 64A. When the screen display routine is entered into, a position variable Y indicating the number of driving times in the Y-axis direction is set to Y=1 (Step S361), and subsequently a position variable X indicating a position of coils of each of the electromagnetic noise sensor rows EN2$f$ through EN2$i$ is set at X=1 (Step S362). Because the number of coils in each of the electromagnetic noise sensor rows is 24, Xmax equals 24, and because the distance of adjacent coils in both row and column directions is $\underline{a}$, Ymax equals 16 corresponding to an A4 size.

Following Step S362, an electromagnetic noise level and electromagnetic noise generating source direction are displayed at a position of the position variables X, Y on the screen of the display device 8 (Step S363). Following Step S363, the value of position variable X is incremented (Step S364) and thereafter it is checked whether or not the value of the incremented position variable is Xmax or less, and when it is discerned that it is Xmax or less, the steps from Step S363, are repeated until the incremented position variable X exceeds Xmax (Step S365). In accordance with being repeated until the incremented position variable X exceeds Xmax, the electromagnetic noise level display and the directional display of the electromagnetic noise generating noise, of one column portion of the electromagnetic noise sensor, are carried out from the left on the display device 8.

In Step S365, when it is discerned that the value of the incremented position variable X exceeds Xmax, the value of the position variable Y is incremented (Step S366), and thereafter it is checked whether or not the incremented value of the position variable Y is Ymax or less. When it is discerned that it is Ymax or less, the steps are repeated until the value of the incremented position variable Y exceeds Ymax (Step S367). In accordance with being repeated until the incremented position variable Y exceeds Ymax, display of one row portion of the electromagnetic sensor is successively made on the screen of the display device 8, from a lower end of the measurement range (Ymax−1 row portion) until the upper end thereof. As a result, the electromagnetic noise level display and display of direction of the electromagnetic noise generating source are carried out across the full range of the measurement range on the screen of the display device.

Figure 16A:
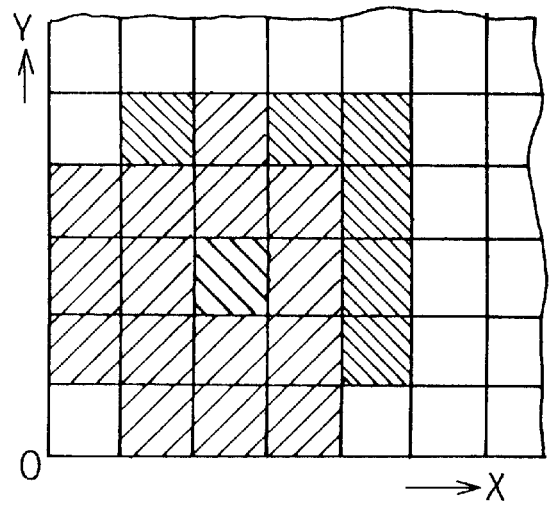
FIG. 16A is a typical view accompanying description of the display of electromagnetic noise levels in the second embodiment of the present inventinion.
Figure 16B:
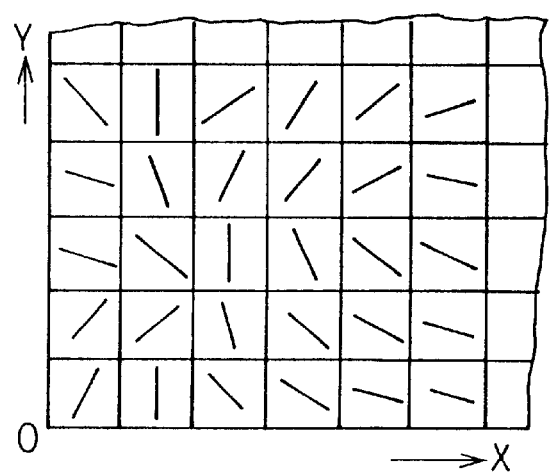
FIG. 16B is a typical view accompanying description of the display of directions of the electromagnetic noise generating source, in the second embodiment of the present invention.
Figure 16C:
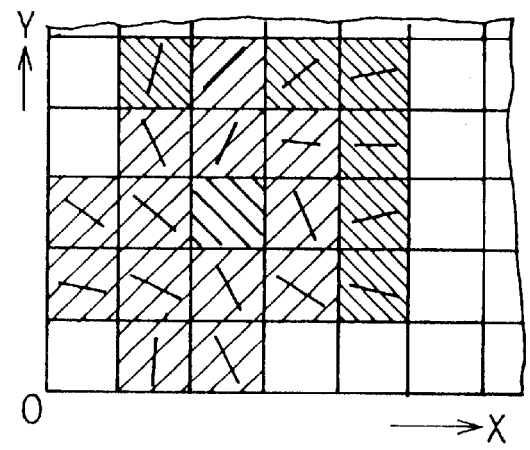
FIG. 16C is a typical view accompanying description of the display of electromagnetic noise levels and directions of the electromagnetic noise generating source, in the second embodiment of the present invention.

FIG. 16A shows a typical display of only the electromagnetic noise level, FIG. 16B shows a typical display of only the direction display of the electromagnetic noise generating source, and FIG. 16C is a typical display of the case of a superimposed display of the electromagnetic noise level and display of direction of the electromagnetic noise generating source, wherein the formal display shown in FIG. 16C is displayed on a screen of the display device 8.

In the second embodiment of the present invention described above, a case is displayed in which four rows of first through fourth electromagnetic noise sensor rows EN2$f$ through EN2$i$ are disposed on the base substrate 3A, however, the two rows of the third and fourth electromagnetic noise sensor rows EN2$h$ and EN2$i$ may be omitted, and it is acceptable that only two rows of the first and second electromagnetic noise sensor rows EN2$f$ and EN2$g$ are disposed thereon.

Further, concerning the coils forming the first through fourth electromagnetic noise sensor rows EN2$f$ through EN 2$i$, a case wherein they are arranged in the X-axis direction at roughly 135° and 45° angles, and roughly 225° and −45° angles has been exemplified, however, the mutually adjacent coils may also be arranged in a state in which, from the state shown in FIG. 10A and FIG. 10B, an angle rotation inside of roughly 45° is made.

Still further, in the case of a movement length of one time in the Y-axis direction is taken as (a/integer), the resolution of the measurement position of the Y-axis direction can be improved. Further, when moved in the X-axis direction, the resolution of the X-axis direction measurement position can likewise be improved.

As discussed above, according to the electromagnetic noise measurement apparatus of the present invention, an effect is attained in that an electromagnetic noise level and generating direction of the electromagnetic source can be measured, and further can be displayed.

Further, according to the electromagnetic noise measurement apparatus of the present invention, an effect is attained in that measurement of electromagnetic noise in the wide band GHz range is enabled.

Still further, according to the electromagnetic noise measurement apparatus of the present invention, an affect is attained in that, since base substrate equipped with plural electromagnetic noise sensors is driven, the time of mechanical movement thereof can be shortened, and furthermore, because the drive source is halted during measurement, a specialized device for eliminating electrical noise caused from the drive source itself is unnecessary.

What is claimed is:

1. An electromagnetic noise detecting device for measuring electromagnetic noise in a vicinity of an integral structure base, comprising:

an integral structure base made by perpendicularly intersecting and integrally constructing a first substrate having formed on a surface thereof a first electromagnetic noise sensor and a second substrate having formed on a surface thereof a second electromagnetic noise sensor;

drive means for moving the integral structure base a predetermined distance in a direction of the first substrate;

memory means for storing a first induced voltage value output from the first electromagnetic noise sensor at a position immediately preceding driving thereof by said drive means, storing a second induced voltage value output from the second electromagnetic noise sensor at a position when the integral structure base is moved only a predetermined distance in a direction of the first substrate, and further interconnecting in parallel the first electromagnetic noise sensor and the second electromagnetic noise sensor and storing a third induced voltage value output from the parallel connected electromagnetic noise sensors at the position of movement;

computation means for determining an electromagnetic noise level based on the first and second induced voltage values stored by the memory means, comparing the first and second induced voltage values stored by the memory means, and determining a direction of an electromagnetic noise generating source based on both a comparison of the first and second induced voltage values and whether a largest induced voltage value from among the first and second induced voltage values is larger than the third induced voltage value; and display means for displaying the electromagnetic noise level and the direction of the electromagnetic noise generating source, determined by the computation means, at a position corresponding to the position of the first electromagnetic noise sensor formed on the first substrate which was driven by the driving means.

2. The electromagnetic noise measurement apparatus according to claim 1, wherein the electromagnetic noise sensor comprises:

a pair of dielectric substrates disposed facing with each other and formed integrally;

substantially C-shaped ground conductors which are formed the same as and on an outer surface of the pair of respective dielectric substrates;

a substantially half-turn strip conductor set at a predetermined characteristic value impedance, having as a first position a fixed position which is opposite to the notch on one of the ground conductors, and having as a second position a fixed position which is in the vicinity of the notch on said one ground conductor, and being formed between the pair of dielectric substrates, and further extending around one half-circumference of the ground conductor from a position on the interior surface of the dielectric substrate at the first position, crossing the notch and extending along another half-circumference of the ground conductor until a position on an inner surface of the dielectric substrate at the second position, wherein at the second position, respective ground conductors are electrically connected with the strip conductor, a beginning position of the strip conductor is connected to an inner conductor of a coaxial cable, defining a shielded loop coil for extracting an induced voltage between the strip conductor and the ground conductor and outputting it to a switch circuit.

3. An electromagnetic noise detecting apparatus for measuring an electromagnetic noise in a vicinity of an integral structure base, comprising:

an integral structural base made up of a plurality of first substrates having a first electromagnetic sensor formed on a surface thereof, and second substrate having second electromagnetic noise sensors formed thereon mutually intersecting a front surface and a rear surface at a predetermined interval separation in an X-axis direction, wherein the first substrate orthogonally intersects and is formed integrally with the second substrate so that the first electromagnetic noise sensor orthogonally intersects the second electromagnetic noise sensor at a position proximate to the second electromagnetic noise sensor;

driving means for moving the unitary structural body a predetermined distance in a direction of the first substrate;

memory means for storing a second induced voltage value output from the second electromagnetic noise sensors at a position immediately preceding movement by said driving means, storing a second induced voltage value output from the second electromagnetic noise sensors when the integral structural base is moved only for a predetermined distance in a direction of the first substrate, and further interconnecting in parallel the first electromagnetic noise sensors and the second electromagnetic noise sensor, which are at a mutually proximate position at the position of movement, and storing a third induced voltage value output from the parallel connected electromagnetic noise sensors;

computational means for determining an electromagnetic noise level based on the first induced voltage value and the second induced voltage value at the mutual proximate position stored in the memory means, and determining a direction of the electromagnetic noise source based on both a comparison of the first and second induced voltage values at the mutual proximate position stored in the memory means and whether the largest induced voltage among said first induced voltage value and the second induced voltage value at said mutual proximate position is larger than the third induced voltage value output from the parallel connected electromagnetic noise sensor formed by parallel connecting the mutually proximately positioned first electromagnetic noise sensor and second electromagnetic noise sensor; and display means for displaying the electromagnetic noise level and the direction of the electromagnetic noise generating source, determined by the computation means, at a position corresponding to the position of each first electromagnetic noise sensor formed on the first substrate which was driven by the driving means.

4. The electromagnetic noise measurement apparatus according to claim 3, wherein the electromagnetic noise sensor comprises:

a pair of dielectric substrates disposed facing with each other and formed integrally;

substantially C-shaped ground conductors which are formed the same as and on an outer surface of the pair of respective dielectric substrates;

a substantially half-turn strip conductor set at a predetermined characteristic value impedance, having as a first position a fixed position which is opposite to the notch on one of the ground conductors, and having as a second position a fixed position which is in the vicinity of the notch on said one ground conductor, and being formed between the pair of dielectric substrates, and further extending around one half-circumference of the ground conductor from a position on the interior surface of the dielectric substrate at the first position, crossing the notch and extending along another half-circumference of the ground conductor until a position on an inner surface of the dielectric substrate at the second position, wherein at the second position, respective ground conductors are electrically connected with the strip conductor, a beginning position of the strip conductor is connected to an inner conductor of a coaxial cable, defining a shielded loop coil for extracting an induced voltage between the strip conductor and the ground conductor and outputting it to a switch circuit.

5. The electromagnetic noise measurement apparatus according to claim 3, further comprising a switch means for successively and selectively outputting to the memory means the induced voltage values output from the first and second electromagnetic noise sensors.

6. The electromagnetic noise measuring apparatus according to claim 5, wherein the switch means comprises relays attached to a rear surface of a base substrate.

7. The electromagnetic noise measuring apparatus according to claim 5, wherein said switch means comprises wide band mechanical relays set at a predetermined characteristic impedance.

8. An electromagnetic noise measuring apparatus, comprising:

a base substrate having disposed upright on a surface thereof a first electromagnetic noise sensor row made up from electromagnetic noise sensors disposed so that an enclosed angle of the electromagnetic noise sensors, which are disposed mutually adjacent and separated a fixed interval in the X-axis direction, is substantially 90°, and a second electromagnetic noise sensor row made up of electromagnetic noise sensors disposed separated a fixed interval in the Y-axis direction and confronting with respect to the first electromagnetic noise sensor row, and further being arranged in the X-axis direction so that an angle is substantially 90° with the angle at which the first electromagnetic noise sensor row are arranged, and further being disposed separated a fixed interval confronting a planar body on which a concerned electromagnetic noise measuring body under test is placed;

switch means for successively and selectively outputting induced voltages output from each of the first and second electromagnetic noise sensor rows;

drive means for driving the base substrate a distance at least in the Y-axis direction based on a distance corresponding to a Y-direction interval of the first electromagnetic sensor row and the second electromagnetic sensor row;

calculating means for determining an electromagnetic noise level and a direction of an electromagnetic noise source, based on induced voltages output from mutually facing electromagnetic noise sensors in a Y-axis direction of said first and second electromagnetic noise sensor rows, in accordance with an induced voltage output from the second electromagnetic noise sensor row at a time of driving at a position before said driving by the drive means until a position of the first electromagnetic noise sensor row, and an induced voltage output from the first electromagnetic noise sensor row before said driving;

display means for displaying the electromagnetic noise level and the direction of the electromagnetic noise generating source determined by said calculating means, at a display position corresponding to a position of the second electromagnetic noise sensor row, at a time of calculation of the electromagnetic noise level and direction of movement of the electromagnetic noise generating source.

9. The electromagnetic noise measurement apparatus according to claim 8, wherein said first electromagnetic noise sensor row is made up from electromagnetic noise sensors separated a fixed interval in the X-axis direction, and arranged alternately at angles of roughly 135° and 45°.

10. The electromagnetic noise measurement apparatus according to claim 8, wherein the electromagnetic noise sensor comprises:

a pair of dielectric substrates disposed facing with each other and formed integrally;

substantially C-shaped ground conductors which are formed the same as and on an outer surface of the pair of respective dielectric substrates;

a substantially half-turn strip conductor set at a predetermined characteristic value impedance, having as a first position a fixed position which is opposite to the notch on one of the ground conductors, and having as a second position a fixed position which is in the vicinity of the notch on said one ground conductor, and being formed between the pair of dielectric substrates, and further extending around one half-circumference of the ground conductor from a position on the interior surface of the dielectric substrate at the first position, crossing the notch and extending along another half-circumference of the ground conductor until a position on an inner surface of the dielectric substrate at the second position, wherein at the second position, respective ground conductors are electrically connected with the strip conductor, a beginning position of the strip conductor is connected to an inner conductor of a coaxial cable, defining a shielded loop coil for extracting an induced voltage between the strip conductor and the ground conductor and outputting it to a switch circuit.

11. The electromagnetic noise measuring apparatus according to claim 8, wherein the switch means comprises relays attached to a rear surface of a base substrate.

12. The electromagnetic noise measuring apparatus according to claim 8, wherein said switch means comprises wide band mechanical relays set at a fixed characteristic impedance.

13. The electromagnetic noise measurement apparatus according to claim 8, wherein the calculating means comprises means in which the electromagnetic noise level is determined according to a calculation $\sqrt{(\alpha^2+\beta^2)}$, taking $\alpha$ as an induced voltage output from an electromagnetic noise sensor disposed along one direction, and $\beta$ as the an induced voltage output from an electromagnetic noise sensor disposed along another direction, and the direction of the electromagnetic noise generating source is determined according to the calculation $\arctan(\alpha/\beta)$.

* * * * *